United States Patent
Niimi et al.

(10) Patent No.: US 8,202,773 B2
(45) Date of Patent: Jun. 19, 2012

(54) ENGINEERED OXYGEN PROFILE IN METAL GATE ELECTRODE AND NITRIDED HIGH-K GATE DIELECTRICS STRUCTURE FOR HIGH PERFORMANCE PMOS DEVICES

(75) Inventors: Hiroaki Niimi, Dallas, TX (US); Huang-Chun Wen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 385 days.

(21) Appl. No.: 12/551,035

(22) Filed: Aug. 31, 2009

(65) Prior Publication Data
US 2010/0052071 A1    Mar. 4, 2010

Related U.S. Application Data

(60) Provisional application No. 61/092,760, filed on Aug. 29, 2008.

(51) Int. Cl.
*H01L 21/8238* (2006.01)
(52) U.S. Cl. ........ 438/199; 438/197; 438/198; 438/216; 438/240; 438/153; 438/154
(58) Field of Classification Search .......... 438/197–230, 438/240
See application file for complete search history.

(56) References Cited

U.S. PATENT DOCUMENTS

| | | | |
|---|---|---|---|
| 7,612,422 B2 * | 11/2009 | Chambers et al. | 257/407 |
| 2009/0280632 A1 * | 11/2009 | Lin et al. | 438/588 |
| 2009/0302399 A1 * | 12/2009 | Cartier et al. | 257/407 |

* cited by examiner

*Primary Examiner* — Samuel Gebremariam
(74) *Attorney, Agent, or Firm* — Jacqueline J. Garner; Wade J. Brady, III; Frederick J. Telecky, Jr.

(57) ABSTRACT

A PMOS transistor is disclosed which includes a nitrogen containing barrier to oxygen diffusion between a gate dielectric layer and a metal gate in the PMOS transistor, in combination with a low oxygen region of the metal gate in direct contact with the nitrogen containing barrier and an oxygen rich region of the metal gate above the low oxygen content metal region. The nitrogen containing barrier may be formed by depositing nitrogen containing barrier material on the gate dielectric layer or by nitridating a top region of the gate dielectric layer. The oxygen rich region of the metal gate may be formed by depositing oxidized metal on the low oxygen region of the metal gate or by oxidizing a top region of the low oxygen region of the metal gate.

11 Claims, 27 Drawing Sheets

ENGINEERED OXYGEN PROFILE IN METAL GATE ELECTRODE AND NITRIDED HIGH-K GATE DIELECTRICS STRUCTURE FOR HIGH PERFORMANCE PMOS DEVICES

FIELD OF THE INVENTION

This invention relates to the field of integrated circuits. More particularly, this invention relates to metal gates in MOS transistors in integrated circuits.

BACKGROUND OF THE INVENTION

Metal gate electrodes are fabricated in metal oxide semiconductor (MOS) transistors in some advanced integrated circuits (ICs) to increase performance parameters such as on-state drive current. It is observed that p-channel metal-oxide-semiconductor (PMOS) transistors with metal gate electrodes may exhibit an increase in threshold voltages as the gate dielectric layer thicknesses decrease to ranges used in high performance complementary metal-oxide-semiconductor (CMOS) ICs, for example below 2 nanometers. Moreover, work functions of metal gates commonly do not match work functions in p-type polycrystalline silicon gate electrodes, leading to less performance than desired from metal gate PMOS transistors.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a p-channel metal-oxide-semiconductor (PMOS) transistor which includes a nitrogen containing barrier to oxygen diffusion between a gate dielectric layer and a metal gate in the PMOS transistor, in combination with a low oxygen region of the metal gate, with a work function above 5 electron volts, and with an oxygen content below 2 percent, and preferably below 1 percent, in contact with the nitrogen containing barrier and an oxygen rich region of the metal gate, also with a work function above 5 electron volts, with an oxygen content above 10 percent, and preferably above 20 percent, in contact with the low oxygen content metal region. The nitrogen containing barrier may reduce oxygen diffusion from the gate dielectric layer to the metal gate, which may reduce threshold increases in PMOS transistors with gate dielectric layers thinner than 2 nanometers. The low oxygen content metal region reduces gate depletion effects while the oxygen rich metal region desirably increases a work function of the metal gate to a value closer to p-type polycrystalline silicon (commonly known as polysilicon) doped above $10^{19}$ cm$^{-3}$.

The nitrogen containing barrier may be formed by depositing a nitrogen containing barrier material on the gate dielectric layer or by nitridating a top region of the gate dielectric layer.

The oxygen rich region of the metal gate may be formed by depositing an oxidized metal layer on the low oxygen region of the metal gate or by oxidizing a top region of the low oxygen region of the metal gate.

An advantage of the inventive PMOS transistor is that it is compatible with planar fabrication processes and with get replacement fabrication processes.

DESCRIPTION OF THE VIEWS OF THE DRAWING

FIG. 1A through FIG. 1J are cross-sections on an IC containing a first embodiment of the instant invention formed by a planar fabrication process sequence, depicted in successive stages of fabrication.

DETAILED DESCRIPTION

Figure 1A:
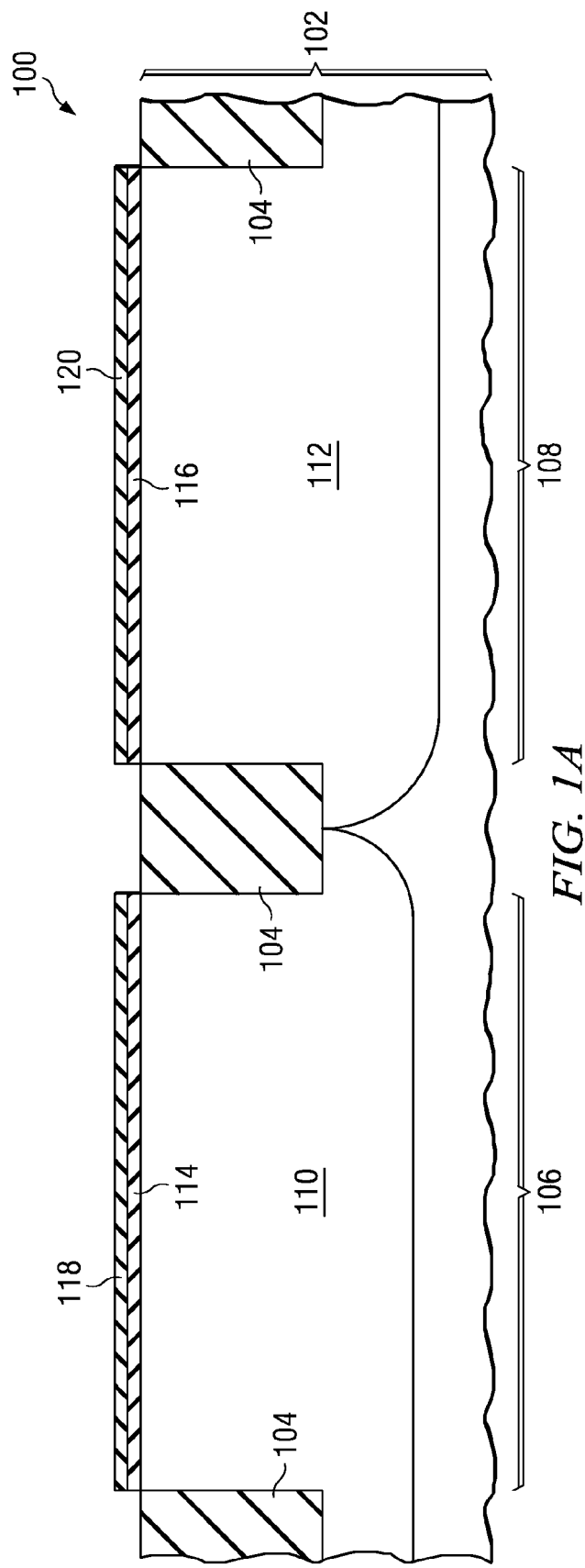

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The problem of threshold increases and work function mismatches in metal gate PMOS transistors with gate dielectric layers thinner than 2 nanometers is addressed by the instant invention, which provides a nitrogen containing barrier to oxygen diffusion between a gate dielectric layer and a metal gate in a p-channel metal oxide semiconductor (PMOS) transistor, in combination with a low oxygen region of the metal gate, with an oxygen content below 2 percent, in contact with the nitrogen containing barrier and an oxygen rich region of the metal gate, with an oxygen content above 10 percent, in contact with the low oxygen content metal region. The nitrogen containing barrier may reduce oxygen diffusion from the gate dielectric layer to the metal gate, which may reduce threshold increases in PMOS transistors with gate dielectric layers thinner than 2 nanometers. The low oxygen content metal region reduces gate depletion effects while the oxygen rich metal region desirably increases a work function of the metal gate to a value closer to p-type polysilicon.

A first embodiment of the instant invention may be formed by a planar fabrication process sequence. A second embodiment may be formed by a gate replacement fabrication process sequence.

FIG. 1A through FIG. 1J are cross-sections on an IC containing a first embodiment of the instant invention formed by a planar fabrication process sequence, depicted in successive stages of fabrication. Referring to FIG. 1A, the IC 100 is formed on a substrate 102 which is commonly a single crystal silicon wafer, but may be a silicon-on-insulator (SOI) wafer, a hybrid orientation technology (HOT) wafer with regions of different crystal orientations, or other material appropriate for fabrication of the IC 100. Elements of field isolation 104 are formed at a top surface of the substrate 102, typically of silicon dioxide between 250 and 600 nanometers thick, commonly by shallow trench isolation (STI) or local oxidation of silicon (LOCOS) processes. In STI processes, silicon dioxide may be deposited by high density plasma (HDP) or high aspect ratio process (HARP). An element of field isolation 104 separates a region in the IC 100 defined for an n-channel metal oxide semiconductor (NMOS) transistor 106 from a region in the IC 100 defined for a PMOS transistor 108. A p-type well 110, commonly called a p-well, is formed in the substrate 102, typically by ion implanting a p-well set of p-type dopants, including boron and possibly gallium and/or indium, at doses from $1 \cdot 10^{11}$ to $1 \cdot 10^{14}$ atoms/cm$^2$, into the NMOS region 106. A p-well photoresist pattern, not shown in FIG. 1A for clarity, is commonly used to block the p-well set of p-type dopants from regions outside the p-well 110. The p-well 110 extends from a top surface of the substrate 102 to a depth typically 50 to 500 nanometers below a bottom surface of the field isolation elements 104. The ion implantation process to form the p-well 110 may include additional steps to implant additional p-type dopants at shallower depths for purposes of improving NMOS transistor performance, such as threshold adjustment, leakage current reduction and suppression of parasitic bipolar operation. An n-type well 112, commonly called an n-well, is formed in the substrate 102, typically by ion implanting an n-well set of n-type dopants, including phosphorus and arsenic, and possibly antimony, at doses from $1 \cdot 10^{11}$ to $1 \cdot 10^{14}$ atoms/cm$^2$, into the PMOS region 108. An n-well photoresist pattern, not shown in FIG. 1A for clarity, is commonly used to block the n-well set of n-type dopants from regions outside the n-well 112. The n-well 112 extends from the top surface of the substrate 102 to a depth typically 50 to 500 nanometers below the bottom surface of the field isolation elements 104. The ion implantation process to form the n-well 112 may include additional steps to implant additional n-type dopants at shallower depths for purposes of improving PMOS transistor performance, such as threshold adjustment, leakage current reduction and suppression of parasitic bipolar operation. A sheet resistivity of the n-well 112 is commonly between 100 and 1000 ohms/square.

Continuing to refer to FIG. 1A, an NMOS gate dielectric layer 114 is formed on a top surface of the p-well 110, typically of silicon dioxide, nitrogen doped silicon dioxide, silicon oxy-nitride, hafnium oxide, hafnium silicate, hafnium silicon oxy-nitride, layers of silicon dioxide and silicon nitride, or other high-dielectric-constant (high-k) dielectric material, and typically between 1 and 3 nanometers thick, using any of a variety of gate dielectric formation process, for example thermal oxidation, plasma nitridation of an oxide layer, and/or dielectric material deposition by atomic layer deposition (ALD) processes. A PMOS gate dielectric layer 116 is formed on a top surface of the n-well 112, with similar properties as the NMOS gate dielectric layer 114. It is common to form portions or all of the NMOS gate dielectric layer 114 and PMOS gate dielectric layer 116 concurrently.

Still referring to FIG. 1A, an optional NMOS nitrogen containing barrier layer 118 is formed on a top surface of the NMOS gate dielectric layer 114. A PMOS nitrogen containing barrier layer 120 is formed on a top surface of the PMOS gate dielectric layer 116. The NMOS nitrogen containing barrier layer 118, if formed, is preferably formed concurrently with the PMOS nitrogen containing barrier layer 120. The PMOS nitrogen containing barrier layer 120 may be formed by growing or depositing a layer of nitrogen containing barrier material on the top surface of the PMOS gate dielectric layer 116, or may be formed by nitridating a top region of the PMOS gate dielectric layer 116. In a preferred embodiment, a thickness of the PMOS nitrogen containing barrier layer 120 is between 0.3 and 0.5 nanometers.

Figure 1B:
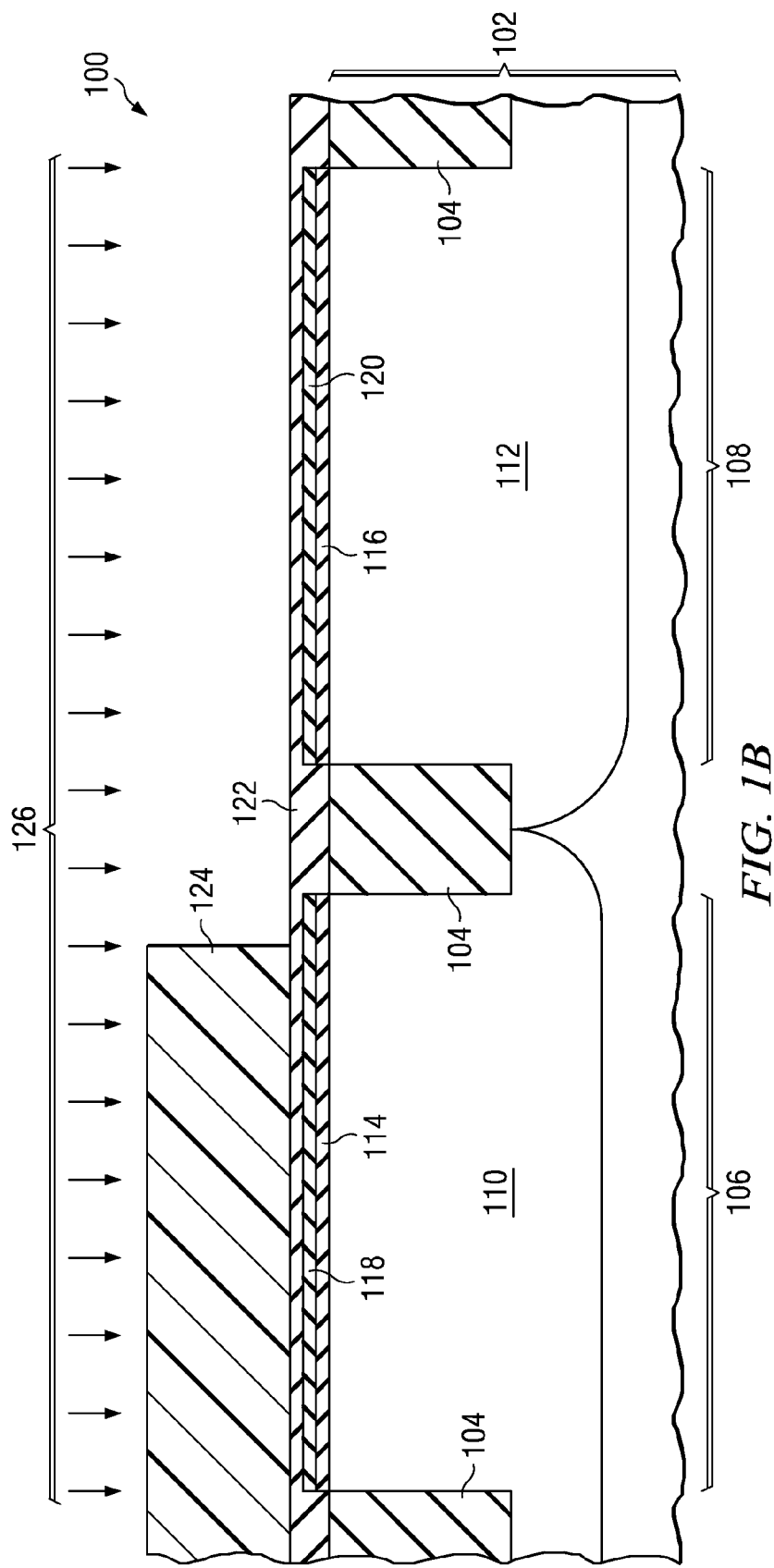

FIG. 1B depicts the IC 100 during formation of an NMOS metal gate. An NMOS metal gate layer 122, possibly titanium nitride or tantalum silicon nitride, preferably between 1 and 10 nanometers thick, is formed on a top surface of the NMOS nitrogen containing barrier layer 118 and a top surface of the PMOS nitrogen containing barrier layer 120. The NMOS metal gate layer 122 may be formed by physical vapor deposition (PVD) processes, metal-organic chemical vapor deposition (MOCVD) process, ALD processes or other methods. An NMOS metal gate layer photoresist pattern 124 is formed on a top surface of the NMOS metal gate layer 122 to define an area for the NMOS metal gate in the NMOS region 106. A NMOS metal gate layer reactive ion etch process 126, for example a plasma containing halogens such as fluorine or chlorine, removes unwanted NMOS metal gate material from areas exposed by the NMOS metal gate layer photoresist pattern 124. In a preferred embodiment, substantially all the unwanted NMOS metal gate material is removed from areas exposed by the NMOS metal gate layer photoresist pattern 124 and substantially none of the PMOS nitrogen containing barrier layer 120 is removed by the NMOS metal gate layer reactive ion etch process 126. The NMOS metal gate layer photoresist pattern 124 is removed in subsequent processing, for example by exposing the IC 100 to an oxygen containing plasma, followed by a wet cleanup to remove any organic residue from the top surface of the NMOS metal gate layer 122.

Figure 1C:
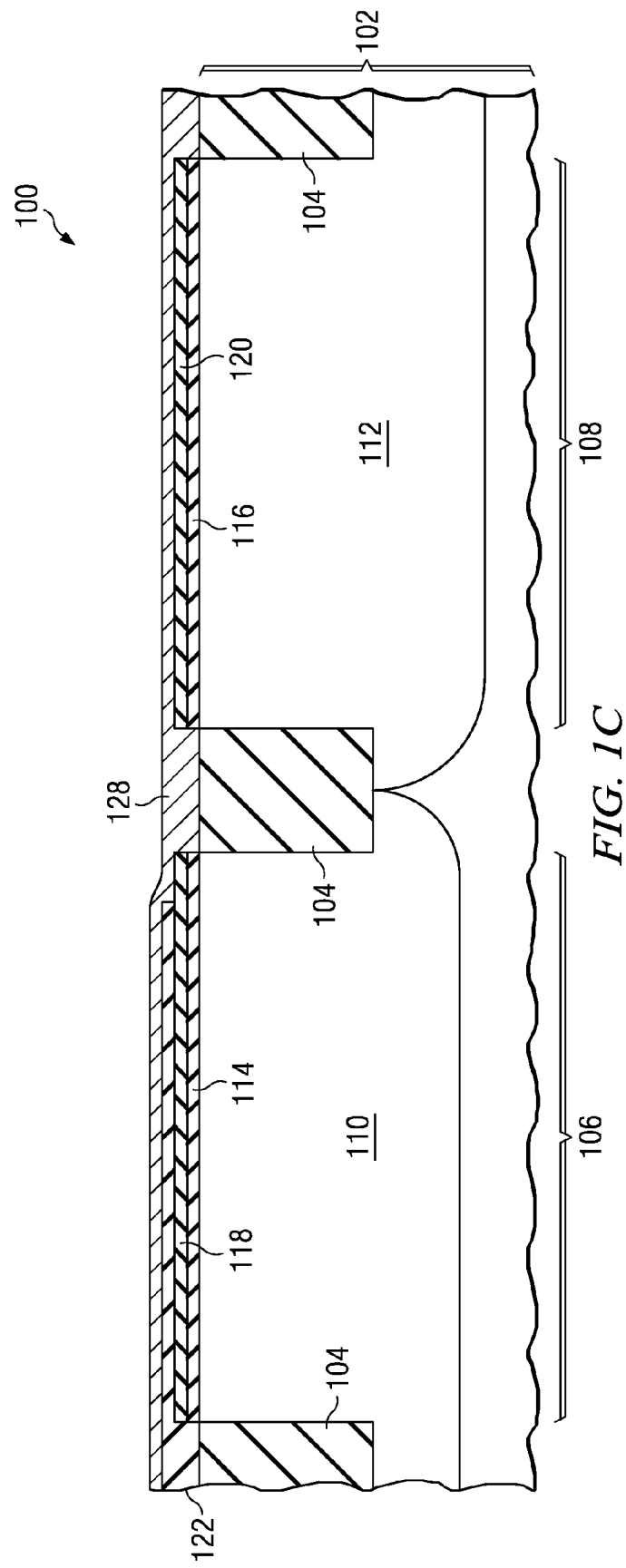

FIG. 1C depicts the IC 100 after formation of a PMOS low oxygen metal layer 128 on the top surface of the PMOS nitrogen containing barrier layer 120 and a top surface of the NMOS metal gate layer 122. The PMOS low oxygen metal layer 128 is preferably formed of a metal or a mixture of metals with a work function greater than 5 electron volts, for example palladium, tungsten, molybdenum, ruthenium, nickel and/or iridium. An oxygen concentration in the PMOS low oxygen metal layer 128 is below 2 percent, and preferably below 1 percent. The PMOS low oxygen metal layer 128 is preferably between 0.5 and 2 nanometers thick, and is preferably formed by ALD processes, but may be formed by PVD, MOCVD or other deposition processes.

Figure 1D:
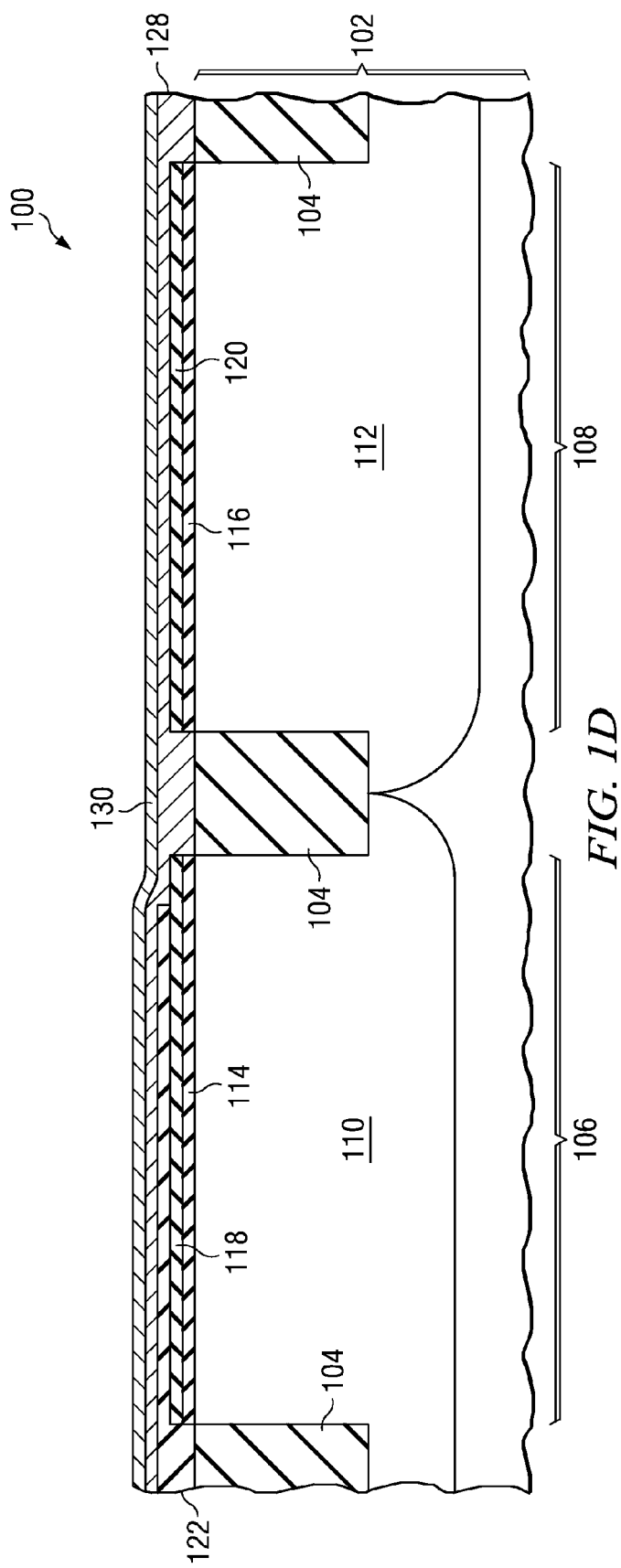

FIG. 1D depicts the IC 100 after formation of a PMOS oxygen rich metal layer 130, for example, oxygen rich palladium, oxygen rich tungsten, oxygen rich molybdenum, oxygen rich ruthenium, oxygen rich nickel and/or oxygen rich iridium, on a top surface of the PMOS low oxygen metal layer 128. The PMOS oxygen rich metal layer 130 may be formed by depositing an oxygen rich layer of metal on the top surface of the PMOS low oxygen metal layer 128, or may be formed by oxidizing a top region of the PMOS low oxygen metal layer 128. In a preferred embodiment, an oxygen concentration in the PMOS oxygen rich metal layer 130 is greater than 20 percent, but may be as low as 10 percent. In a preferred embodiment, a thickness of the PMOS oxygen rich metal layer 130 is between 0.5 and 2 nanometers.

Figure 1E:
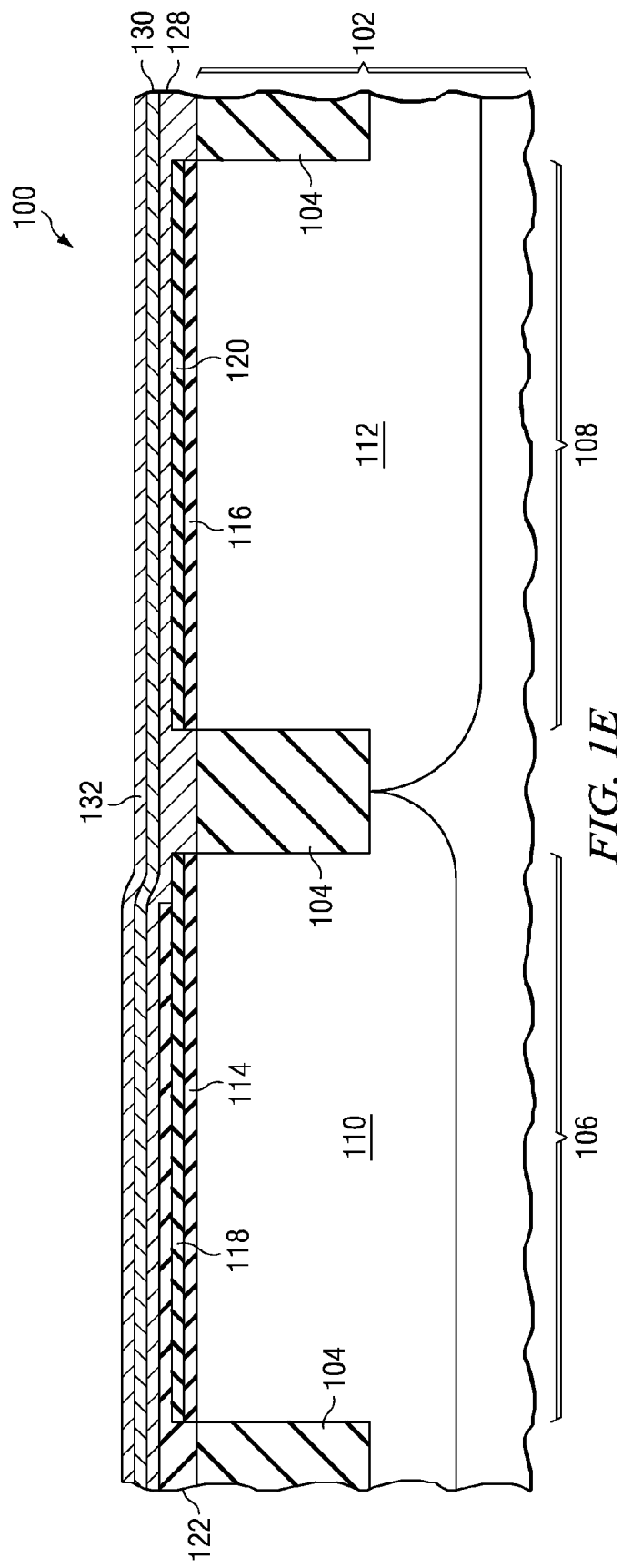

FIG. 1E depicts the IC 100 after formation of a PMOS top metal gate layer 132, preferably of a same composition as the PMOS low oxygen metal layer 128, but possibly another metal or mixture of metals with a work function greater than 5 electron volts, on a top surface of the PMOS oxygen rich metal layer 130. The PMOS top metal gate layer 132 is preferably formed by ALD processes, but may be formed by PVD, MOCVD or other deposition processes. In a preferred embodiment, a thickness of the PMOS top metal gate layer 132 is between 0.5 and 2 nanometers.

Figure 1F:
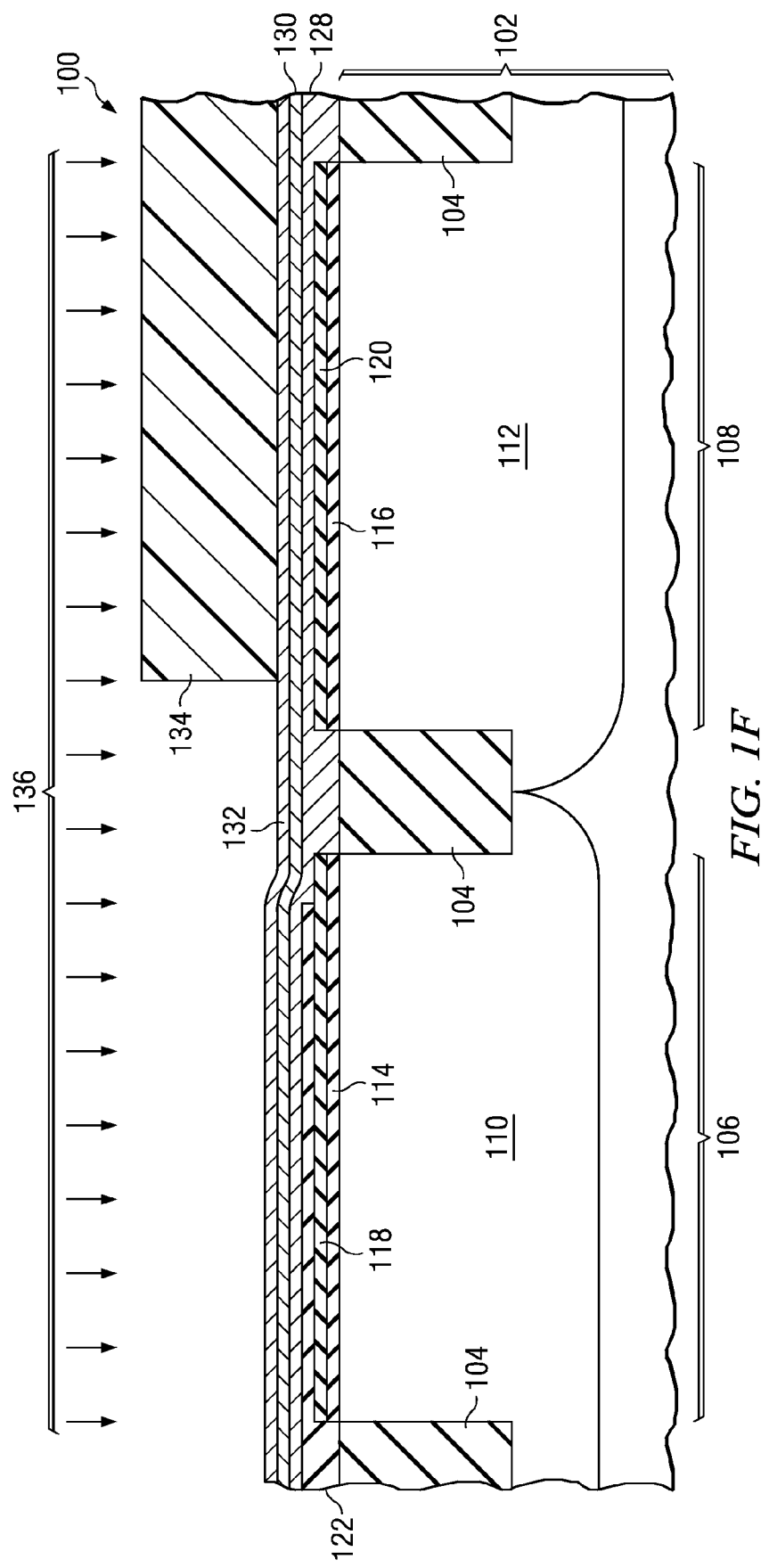

FIG. 1F depicts the IC 100 during formation of a PMOS metal gate stack. A PMOS metal gate stack photoresist pattern 134 is formed on a top surface of the PMOS top metal gate layer 132 to define an area for the PMOS metal gate stack in the PMOS region 108. A PMOS metal gate stack reactive ion etch process 136 removes unwanted material from the PMOS top metal gate layer 132, the PMOS oxygen rich metal layer 130 and the PMOS low oxygen metal layer 128. In a preferred embodiment, the PMOS metal gate stack reactive ion etch process 136 includes three reactive ion etch steps in which gas species, RF power and other process parameters in each step are adjusted to provide clean removal of the PMOS top metal gate layer 132, the PMOS oxygen rich metal layer 130 and the PMOS low oxygen metal layer 128. In a preferred embodiment, substantially all the unwanted PMOS metal gate stack material is removed from areas exposed by the PMOS metal gate stack photoresist pattern 134 and substantially none of the NMOS metal gate layer 122 is removed by the PMOS metal gate stack reactive ion etch process 136. The PMOS metal gate stack photoresist pattern 134 is removed in subsequent processing, for example by exposing the IC 100 to an oxygen containing plasma, followed by a wet cleanup to remove any organic residue from the top surface of the PMOS top metal gate layer 132.

Figure 1G:
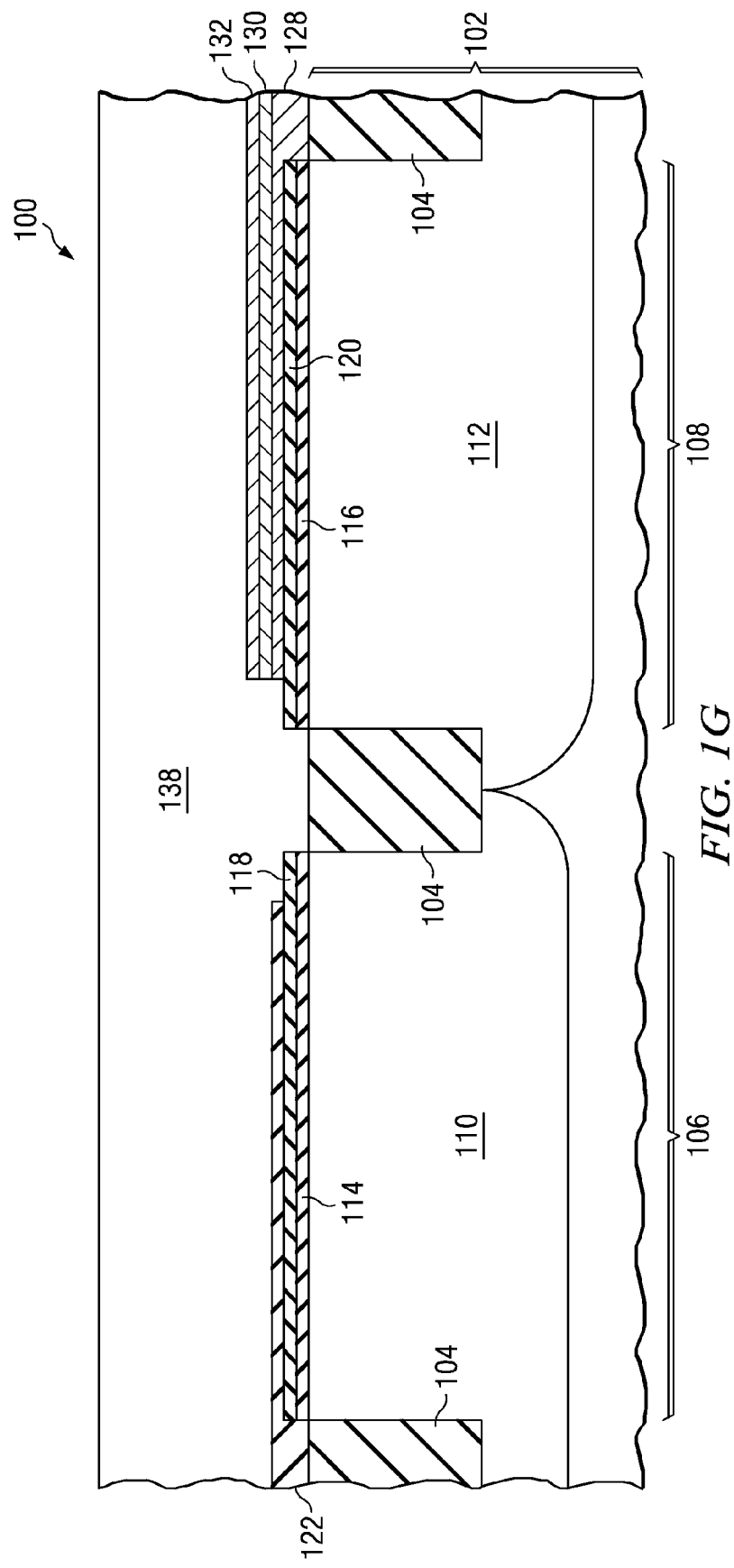

FIG. 1G depicts the IC 100 after formation of a layer of polycrystalline silicon 138, commonly known as polysilicon, on the top surface of the NMOS metal gate layer 122 and the top surface of the PMOS top metal gate layer 132. The polysilicon layer 138 is preferably between 40 and 100 nanometers thick, and may be undoped or doped n-type or p-type. Formation of the polysilicon layer 138 is preferably performed using known methods of polysilicon gate layer deposition as commonly used in CMOS IC fabrication.

Figure 1H:
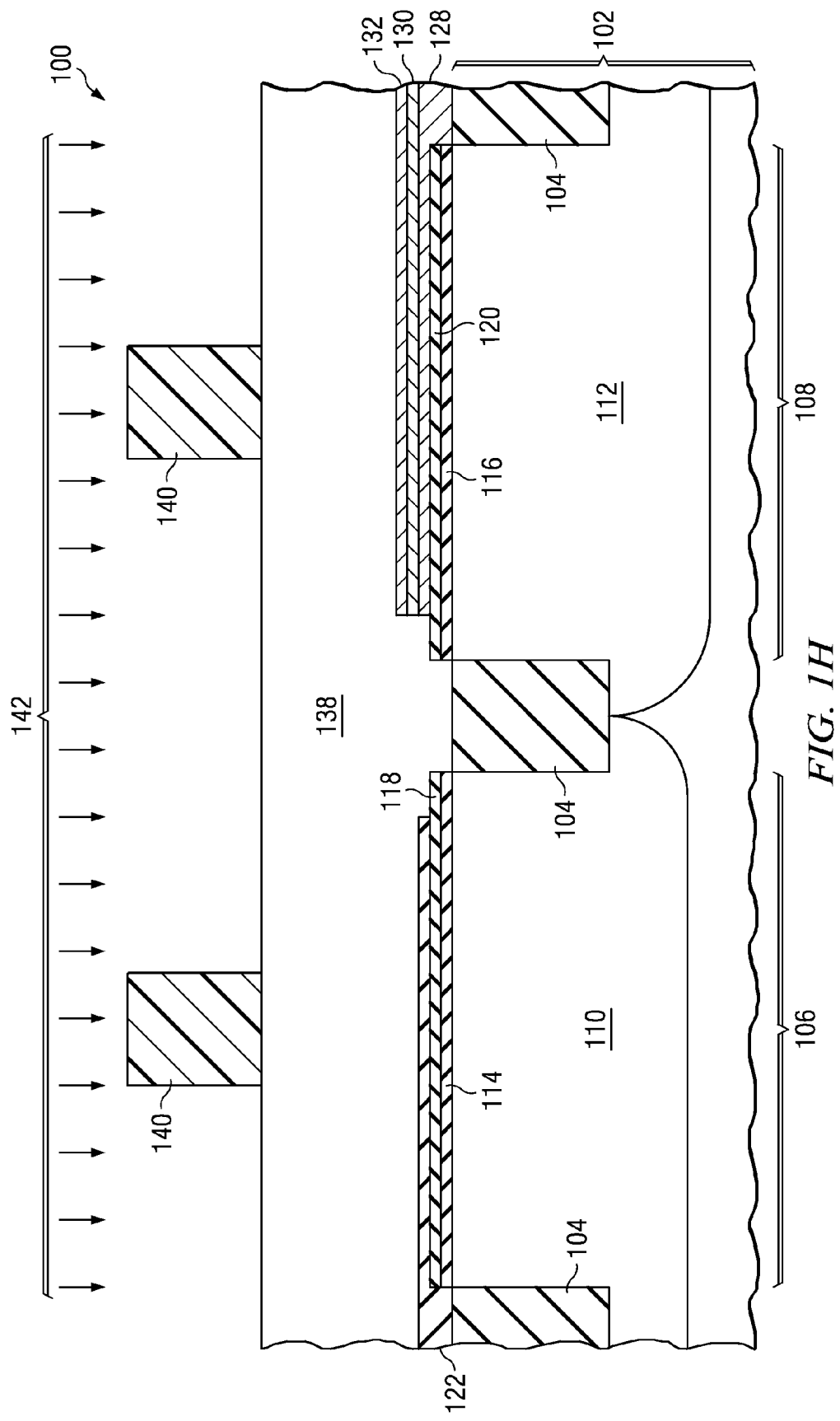
Figure 11:
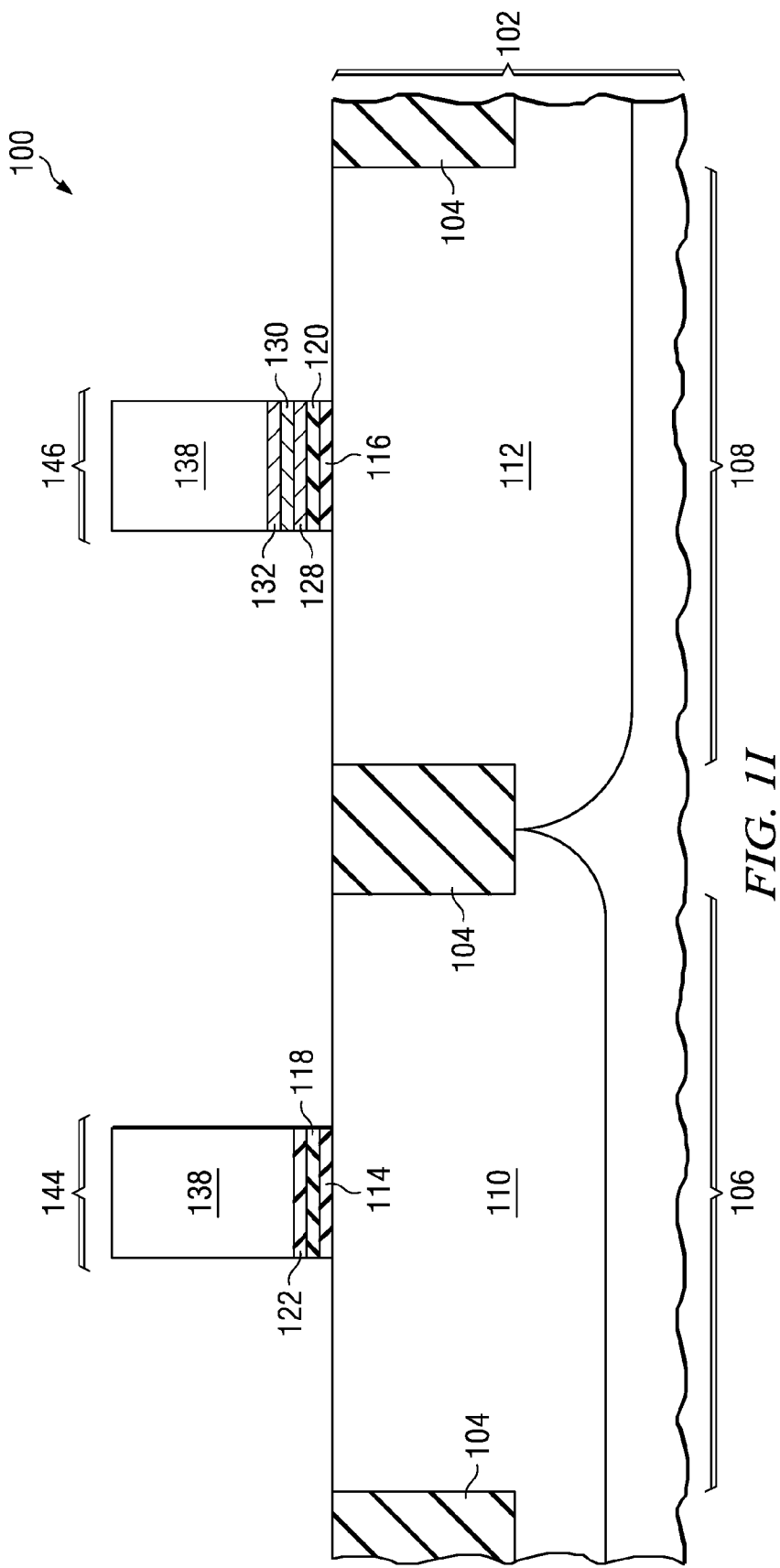

FIG. 1H depicts the IC 100 during a gate etch process. A gate photoresist pattern 140 is formed on a top surface of the polysilicon layer 138 to define areas for an NMOS gate in the NMOS region 106 and a PMOS gate in the PMOS region 108. A lateral width of the NMOS gate area is less than a lateral width of the NMOS metal gate layer 122 and a lateral width of the PMOS gate area is less than a lateral width of the PMOS metal gate stack. A gate etch process 142 removes unwanted material from the polysilicon layer 138, the PMOS top metal gate layer 132, the PMOS oxygen rich metal layer 130, the PMOS low oxygen metal layer 128, the NMOS metal gate layer 122, the PMOS nitrogen containing barrier layer 120, the NMOS nitrogen containing barrier layer 118, the PMOS gate dielectric layer 116 and the NMOS gate dielectric layer 114. In a preferred embodiment, the gate etch process 142 includes four or more reactive ion etch steps in which gas species, RF power and other process parameters in each step are adjusted to provide clean removal of the polysilicon layer 138, the PMOS top metal gate layer 132, the PMOS oxygen rich metal layer 130, the PMOS low oxygen metal layer 128, the NMOS metal gate layer 122, the PMOS nitrogen containing barrier layer 120, the NMOS nitrogen containing barrier layer 118, the PMOS gate dielectric layer 116 and the NMOS gate dielectric layer 114. In a preferred embodiment, substantially all the unwanted material in the polysilicon layer 138, the PMOS top metal gate layer 132, the PMOS oxygen rich metal layer 130, the PMOS low oxygen metal layer 128, the NMOS metal gate layer 122, the PMOS nitrogen containing barrier layer 120, the NMOS nitrogen containing barrier layer 118, the PMOS gate dielectric layer 116 and the NMOS gate dielectric layer 114 is removed while substantially none of the substrate 102 in the p-well 110 or the n-well 112 is removed. The gate photoresist pattern 140 may be partially or completely removed by the gate etch process 142 or may be removed during subsequent processing, for example by exposing the IC 100 to an oxygen containing plasma, followed by a wet cleanup to remove any organic residue from the top surface of the polysilicon 138.

FIG. 1I depicts the IC 100 after the gate etch process is completed. An NMOS gate stack 144 is formed in the NMOS transistor region 106 by the gate etch process, and includes the NMOS gate dielectric layer 114, the NMOS nitrogen containing barrier layer 118, the NMOS metal gate layer 122 and the polysilicon layer 138. A PMOS gate stack 146 is formed in the PMOS transistor region 108 by the gate etch process, and includes the PMOS gate dielectric layer 116, the PMOS nitrogen containing barrier layer 120, the PMOS low oxygen metal layer 128, the PMOS oxygen rich metal layer 130, the PMOS top metal gate layer 132 and the polysilicon layer 138.

Figure 1J:
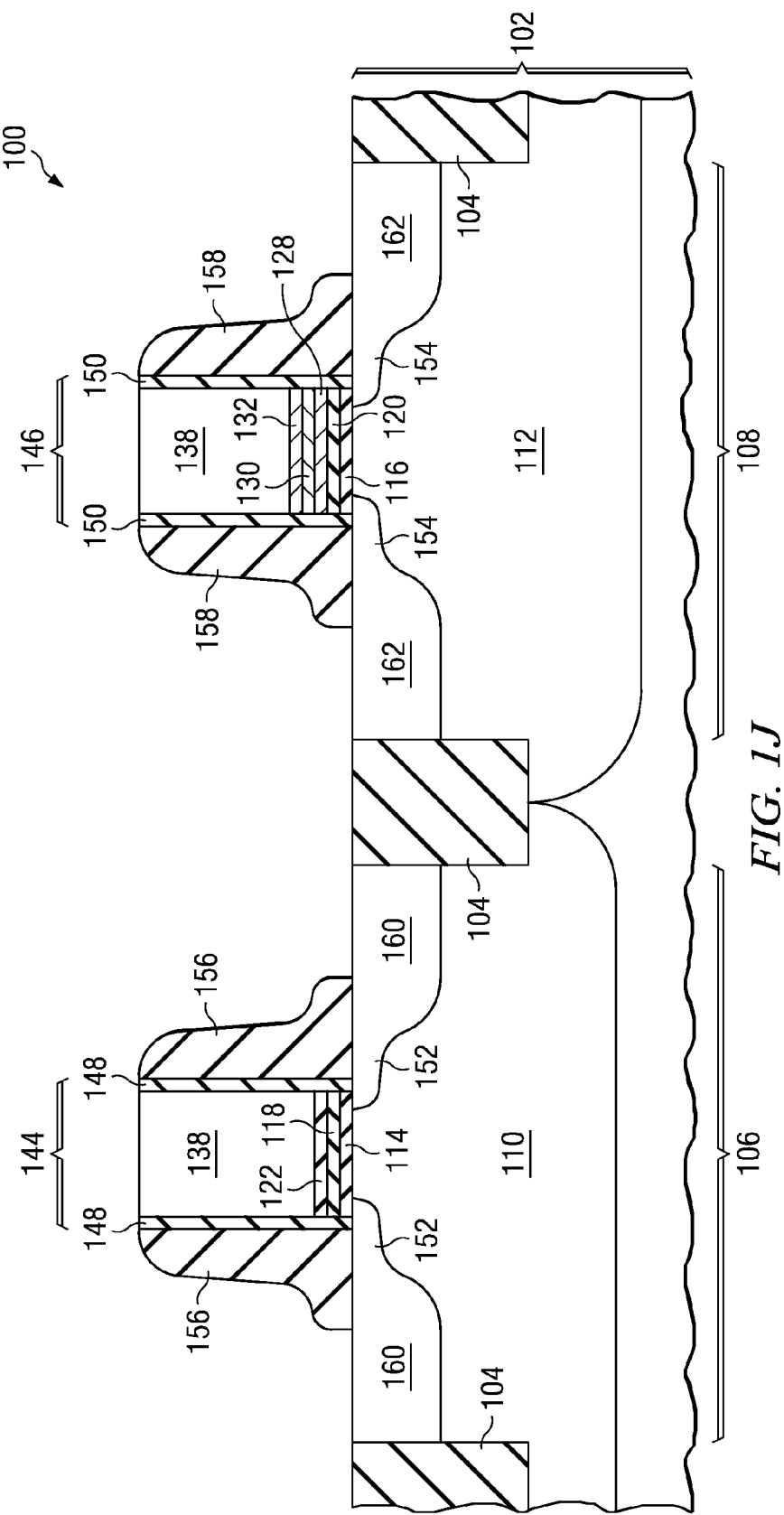

Referring to FIG. 1J, fabrication of the IC 100 continues with formation of NMOS offset spacers 148 on lateral surfaces of the NMOS gate stack 144, by oxidation of exposed surfaces of the NMOS gate stack 144 or by conformal deposition and etchback of one or more layers of silicon dioxide and/or silicon nitride. The NMOS offset spacers 148 are preferably between 3 and 30 nanometers thick. PMOS offset spacers 150, between 3 and 30 nanometers thick, are formed on lateral surfaces of the PMOS gate stack 146 in a similar manner. The thickness of the NMOS offset spacers 148 is not necessarily substantially equal to the thickness of the PMOS offset spacers 150. A portion of the NMOS offset spacers 148 and a portion of the PMOS offset spacers 150 may be formed concurrently. N-type lightly doped drain (NLDD) regions 152 are formed in the p-well 110 adjacent to the NMOS offset spacers 148 by ion implanting an NLDD set of n-type dopants into the p-well 110 in the NMOS transistor region 106 to a depth between 10 and 30 nanometers. Optional p-type halo regions, not shown in FIG. 1J for clarity, may be formed in the p-well 110 abutting the NLDD regions 152 under the NMOS gate dielectric layer 114 by ion implanting an NMOS halo set of p-type dopants at an angle between 10 and 30 degrees into the p-well 110 in the NMOS transistor region 106 to a depth between 20 and 40 nanometers. P-type lightly doped drain (PLDD) regions 154 are formed in the n-well 112 adjacent to the PMOS offset spacers 150 by ion implanting a PLDD set of p-type dopants into the n-well 112 in the PMOS transistor region 108 to a depth between 10 and 30 nanometers. Optional n-type halo regions, not shown in FIG. 1J for clarity, may be formed in the n-well 112 abutting the PLDD regions 154 under the PMOS gate dielectric layer 116 by ion implanting a PMOS halo set of n-type dopants at an angle between 10 and 30 degrees into the n-well 112 in the PMOS transistor region 108 to a depth between 20 and 40 nanometers.

Continuing to refer to FIG. 1J, NMOS gate sidewall spacers 156 are formed on lateral surfaces of the NMOS offset spacers 148, typically by deposition of one or more conformal layers of silicon nitride and/or silicon dioxide on an existing top surface of the IC 100, followed by removal of the conformal layer material from the top surface of the NMOS gate stack 144 and the top surface of the p-well 110 by known anisotropic etching methods, leaving the conformal layer material on the lateral surfaces of the NMOS offset spacers 148. A lateral thickness of the NMOS gate sidewall spacers 156 is preferably between 40 and 100 nanometers thick at the top surface of the p-well 110. PMOS gate sidewall spacers 158 are formed on lateral surfaces of the PMOS offset spacers 150, also typically by deposition of one or more conformal layers of silicon nitride and/or silicon dioxide on an existing top surface of the IC 100, followed by removal of the conformal layer material from the top surface of the PMOS gate stack 146 and the top surface of the n-well 112 by known anisotropic etching methods, leaving the conformal layer material on the lateral surfaces of the PMOS offset spacers 150. A lateral thickness of the PMOS gate sidewall spacers 158 is preferably between 40 and 100 nanometers thick at the top surface of the n-well 112. The thickness of the NMOS gate sidewall spacers 156 is not necessarily substantially equal to the thickness of the PMOS gate sidewall spacers 158. A portion of the NMOS gate sidewall spacers 156 and a portion of the PMOS gate sidewall spacers 158 may be formed concurrently. N-type source and drain (NSD) regions 160 are formed in the p-well 110 abutting the NLDD regions 152 adjacent to the NMOS gate sidewall spacers 156 by ion implanting an NSD set of n-type dopants into the p-well 110 in the NMOS transistor region 106 to a depth between 30 and 100 nanometers. P-type source and drain (PSD) regions 162 are formed in the n-well 112 abutting the PLDD regions 154 adjacent to the PMOS gate sidewall spacers 158 by ion implanting a PSD set of p-type dopants into the n-well 112 in the PMOS transistor region 108 to a depth between 30 and 100 nanometers. Fabrication of the IC 100 is continued using known fabrication practices.

The PMOS nitrogen containing barrier layer 120 desirably reduces oxygen diffusion between the PMOS metal gate layers 128, 130, 132 and the PMOS gate dielectric layer 116, which may improve on-state drive current, especially if the PMOS gate dielectric layer 116 is thinner than 2 nanometers. An oxygen concentration in the PMOS low oxygen metal layer 128 below 1 percent also desirably reduces oxygen diffusion between the PMOS metal gate layers 128, 130, 132 and the PMOS gate dielectric layer 116. An oxygen concentration in the PMOS oxygen rich metal layer 130 above $1 \cdot 10^{14}$ atoms/cm$^2$ desirably increases a work function of the PMOS metal gate layers 128, 130, 132 by 0.2 to 0.3 electron volts.

The embodiment discussed in reference to FIG. 1A through FIG. 1J is advantageous because the processes to form the inventive PMOS gate stack may be integrated into a planar fabrication process sequence of the IC 100 using conventional semiconductor processing equipment.

Figure 2A:
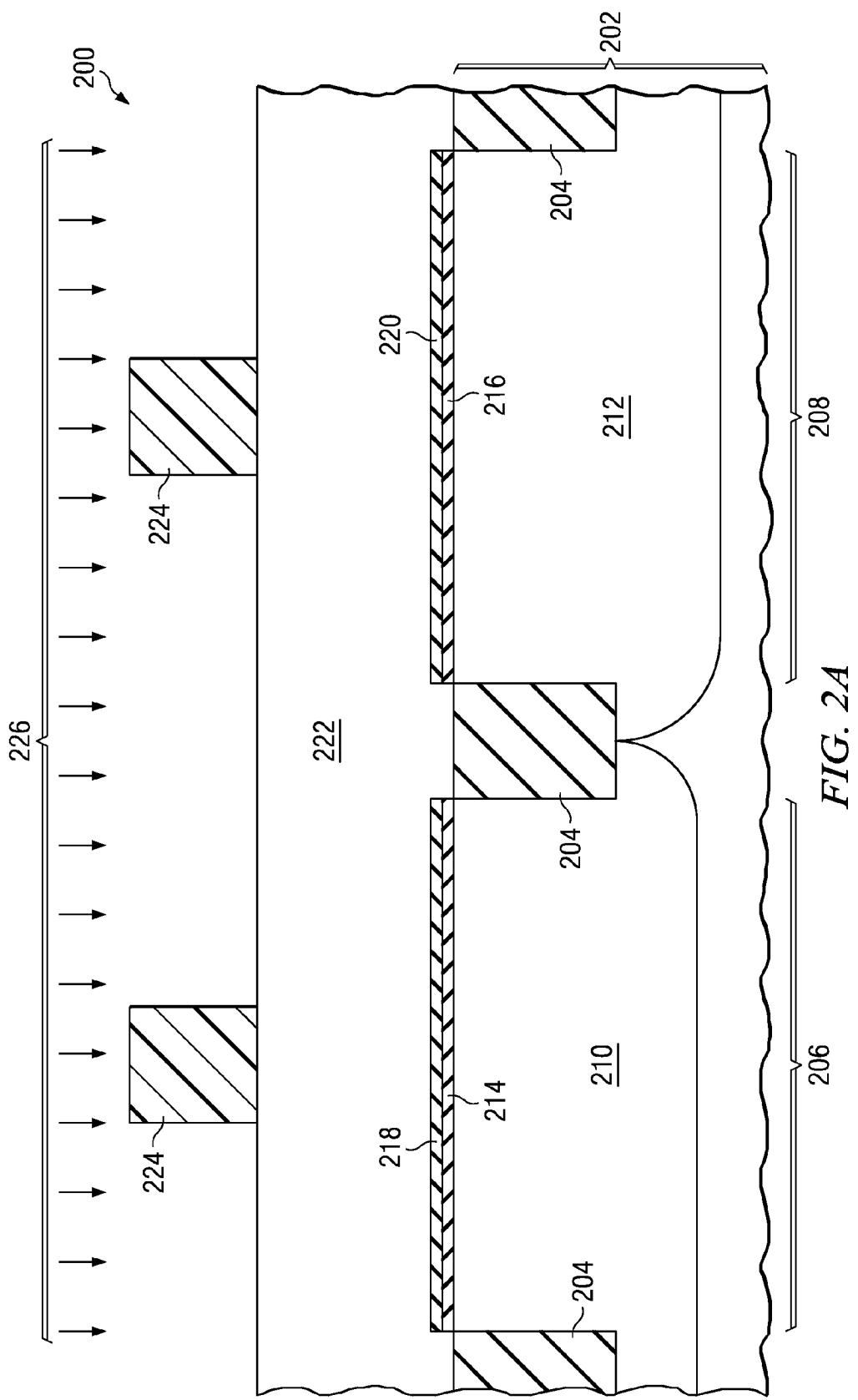
FIG. 2A through FIG. 2H are cross-sections on an IC containing a second embodiment of the instant invention formed by a gate replacement fabrication process sequence, depicted in successive stages of fabrication.

FIG. 2A through FIG. 2H are cross-sections on an IC containing a second embodiment of the instant invention formed by a gate replacement fabrication process sequence, depicted in successive stages of fabrication. Referring to FIG. 2A, the IC 200 is formed on a substrate 202 which has the properties described in reference to FIG. 1A. Elements of field isolation 204 are formed in the substrate 202 as described in reference to FIG. 1A. An element of field isolation 204 separates a region in the IC 200 defined for an NMOS transistor 206 from a region in the IC 200 defined for a PMOS transistor 208. A p-well 210 is formed in the substrate 202 in the NMOS region 206, as described in reference to FIG. 1A. Similarly, an n-well 212 is formed in the substrate 202 in the PMOS region 208, as described in reference to FIG. 1A. An NMOS gate dielectric layer 214 is formed on a top surface of the p-well 210, with the properties described in reference to FIG. 1A. A PMOS gate dielectric layer 216 is formed on a top surface of the n-well 212, with the properties described in reference to FIG. 1A. An optional NMOS nitrogen containing barrier layer 218 is formed on a top surface of the NMOS gate dielectric layer 214 and a PMOS nitrogen containing barrier layer 220 is formed on a top surface of the PMOS gate dielectric layer 216, as described in reference to FIG. 1A.

A polysilicon layer 222 preferably between 40 and 100 nanometers thick is formed on an existing top surface of the IC 200, preferably using methods of polysilicon gate layer deposition commonly used in CMOS IC fabrication. The polysilicon layer 222 is preferably undoped in the instant embodiment. A gate photoresist pattern 224 is formed on a top surface of the polysilicon layer 222 to define areas for an NMOS gate in the NMOS region 206 and a PMOS gate in the PMOS region 208. A gate etch process 226 removes unwanted material from the polysilicon layer 222, the PMOS nitrogen containing barrier layer 220, the NMOS nitrogen containing barrier layer 218, the PMOS gate dielectric layer 216 and the NMOS gate dielectric layer 214. In a preferred embodiment, substantially all the unwanted material in the polysilicon layer 222, the PMOS nitrogen containing barrier layer 220, the NMOS nitrogen containing barrier layer 218, the PMOS gate dielectric layer 216 and the NMOS gate dielectric layer 214 is removed while substantially none of the substrate 202 in the p-well 210 or the n-well 212 is removed. The gate photoresist pattern 224 may be partially or completely removed by the gate etch process 226 or may be removed during subsequent processing, for example by exposing the IC 200 to an oxygen containing plasma, followed by a wet cleanup to remove any organic residue from the top surface of the polysilicon 222.

Figure 2B:
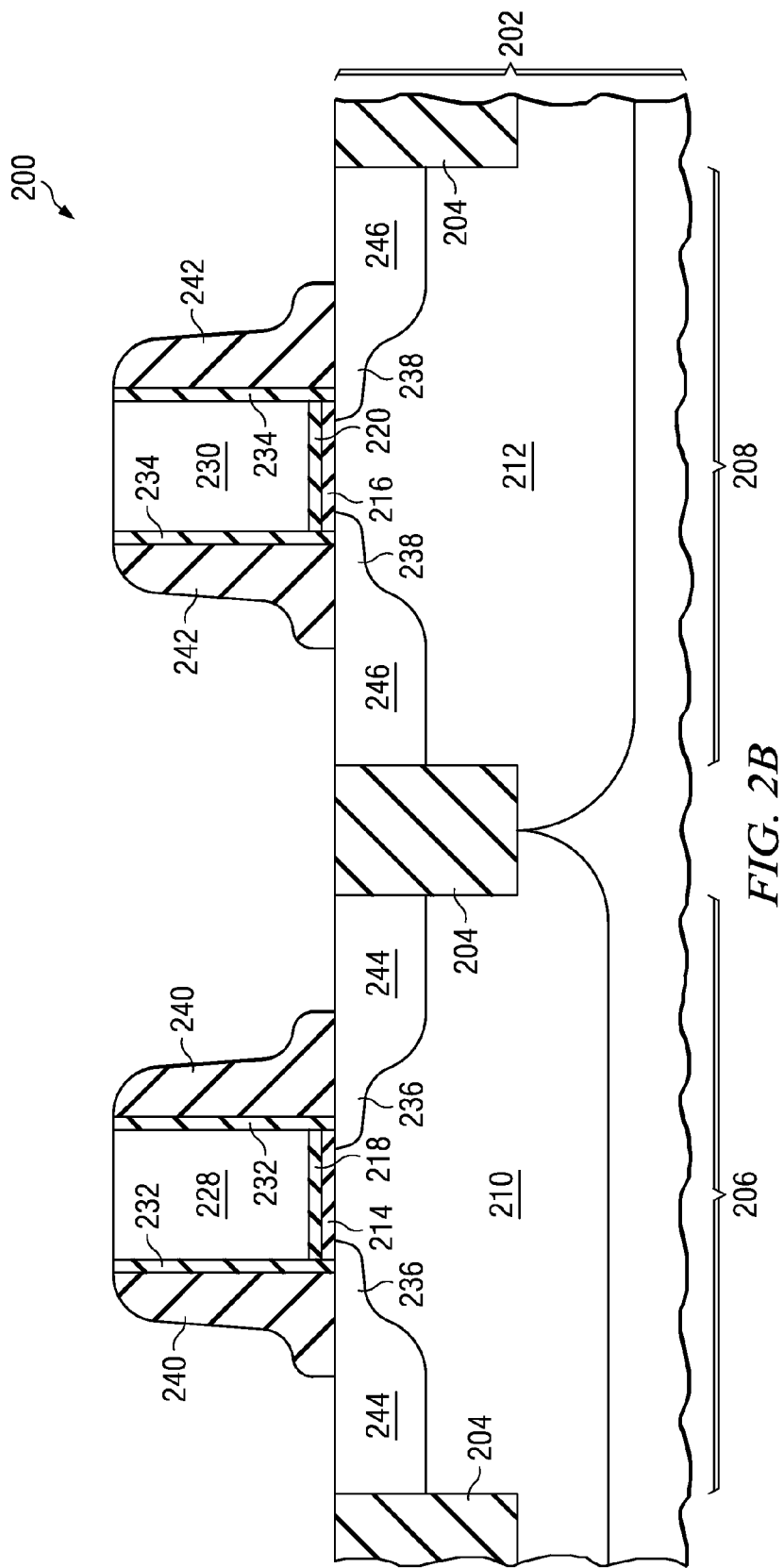

FIG. 2B depicts the IC 200 at a subsequent stage of fabrication. A dummy NMOS gate stack includes the NMOS gate dielectric layer 214, the NMOS nitrogen containing barrier layer 218 and an NMOS polysilicon gate 228. A dummy PMOS gate stack includes the PMOS gate dielectric layer 216, the PMOS nitrogen containing barrier layer 220 and a PMOS polysilicon gate 230. NMOS offset spacers 232 are formed on lateral surfaces of the dummy NMOS gate stack by oxidation of exposed surfaces of the dummy NMOS gate stack or by conformal deposition and etchback of one or more layers of silicon dioxide and/or silicon nitride. The NMOS offset spacers 232 are preferably between 3 and 30 nanometers thick. PMOS offset spacers 234 are formed on lateral surfaces of the dummy PMOS gate stack by oxidation of exposed surfaces of the dummy PMOS gate stack or by conformal deposition and etchback of one or more layers of silicon dioxide and/or silicon nitride. The PMOS offset spacers 234 are preferably between 3 and 30 nanometers thick. The thickness of the NMOS offset spacers 232 is not necessarily substantially equal to the thickness of the PMOS offset spacers 234. A portion of the NMOS offset spacers 232 and a portion of the PMOS offset spacers 234 may be formed concurrently.

Fabrication of the IC 200 continues with formation of n-type lightly doped drain (NLDD) regions 236 in the p-well 210 adjacent to the NMOS offset spacers 232 by ion implanting an NLDD set of n-type dopants into the p-well 210 in the NMOS transistor region 206 to a depth between 10 and 30 nanometers. Optional p-type halo regions, not shown in FIG. 2B for clarity, may be formed in the p-well 210 abutting the NLDD regions 236 under the NMOS gate dielectric layer 214 by ion implanting an NMOS halo set of p-type dopants at an angle between 10 and 30 degrees into the p-well 210 in the NMOS transistor region 206 to a depth between 20 and 40 nanometers. P-type lightly doped drain (PLDD) regions 238 are formed in the n-well 212 adjacent to the PMOS offset spacers 234 by ion implanting a PLDD set of p-type dopants into the n-well 212 in the PMOS transistor region 208 to a depth between 10 and 30 nanometers. Optional n-type halo regions, not shown in FIG. 2B for clarity, may be formed in the n-well 212 abutting the PLDD regions 238 under the PMOS gate dielectric layer 216 by ion implanting a PMOS halo set of n-type dopants at an angle between 10 and 30 degrees into the n-well 212 in the PMOS transistor region 208 to a depth between 20 and 40 nanometers.

Continuing to refer to FIG. 2B, NMOS gate sidewall spacers 240 are formed on lateral surfaces of the NMOS offset spacers 232, typically by deposition of one or more conformal layers of silicon nitride and/or silicon dioxide on an existing top surface of the IC 200, followed by removal of the conformal layer material from the top surface of the NMOS fill metal gate 268 and the top surface of the p-well 210 by known anisotropic etching methods, leaving the conformal layer material on the lateral surfaces of the NMOS offset spacers 232. A lateral thickness of the NMOS gate sidewall spacers 240 is preferably between 40 and 100 nanometers thick at the top surface of the p-well 210. PMOS gate sidewall spacers 242 are formed on lateral surfaces of the PMOS offset spacers 234, also typically by deposition of one or more conformal layers of silicon nitride and/or silicon dioxide on an existing top surface of the IC 200, followed by removal of the conformal layer material from the top surface of the PMOS fill metal gate 270 and the top surface of the n-well 212 by known anisotropic etching methods, leaving the conformal layer material on the lateral surfaces of the PMOS offset spacers 234. A lateral thickness of the PMOS gate sidewall spacers 242 is preferably between 40 and 100 nanometers thick at the top surface of the n-well 212. The thickness of the NMOS gate sidewall spacers 240 is not necessarily substantially equal to the thickness of the PMOS gate sidewall spacers 242. A portion of the NMOS gate sidewall spacers 240 and a portion of the PMOS gate sidewall spacers 242 may be formed concurrently. NSD regions 244 are formed in the p-well 210 abutting the NLDD regions 236 adjacent to the NMOS gate sidewall spacers 240 by ion implanting an NSD set of n-type dopants into the p-well 210 in the NMOS transistor region 206 to a depth between 30 and 100 nanometers. PSD regions 246 are formed in the n-well 212 abutting the PLDD regions 238 adjacent to the PMOS gate sidewall spacers 242 by ion implanting a PSD set of p-type dopants into the n-well 212 in the PMOS transistor region 208 to a depth between 30 and 100 nanometers. Fabrication of the IC 200 is continued using known fabrication practices.

Figure 2C:
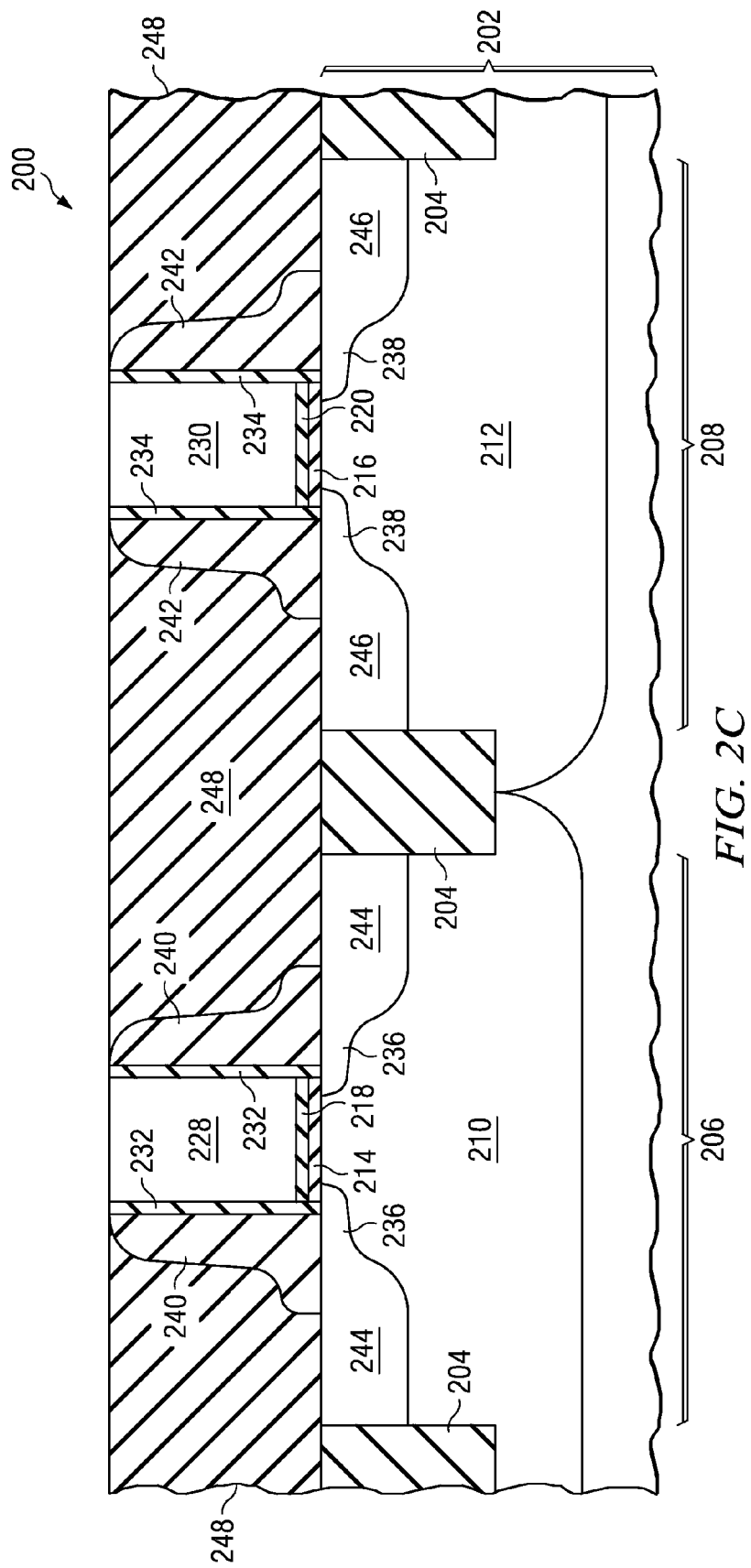

FIG. 2C depicts the IC 200 after formation of an oxide fill layer 248 on the top surfaces of the p-well 210 and the n-well 212. The oxide fill layer 248 may be formed by depositing a silicon dioxide layer on the IC 200, for example by spinning a layer of methylsilsesquioxane (MSQ) and solvent on the IC 200 and evaporating a majority of the solvent, followed by a chemical mechanical polish (CMP) process which removes silicon dioxide from top surfaces of the NMOS polysilicon gate 228 and the PMOS polysilicon gate 230. Other methods of forming the oxide fill layer 248 are within the scope of the instant invention.

Figure 2D:
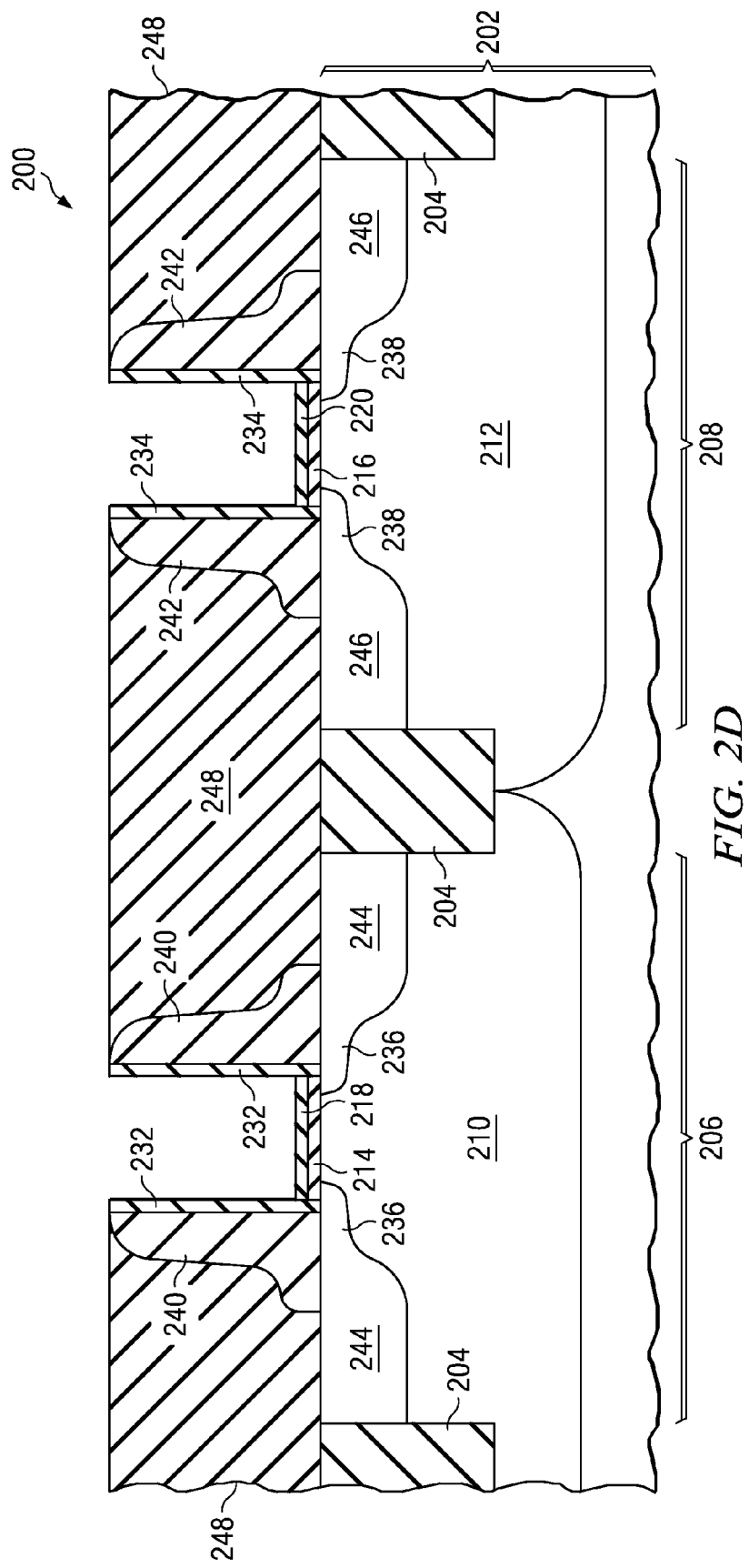

FIG. 2D depicts the IC after removal of the NMOS polysilicon gate 228 and the PMOS polysilicon gate 230. In a preferred embodiment, substantially all the polysilicon over the NMOS gate dielectric layer 214 and over the PMOS gate dielectric layer 216 is etched away while a majority of offset spacer material in the NMOS offset spacers 232 and the PMOS offset spacers 234 remains. The polysilicon may be etched by a reactive ion etch process, for example using a fluorine containing plasma, or by a wet etch process, for example using a choline containing etch solution.

Figure 2E:
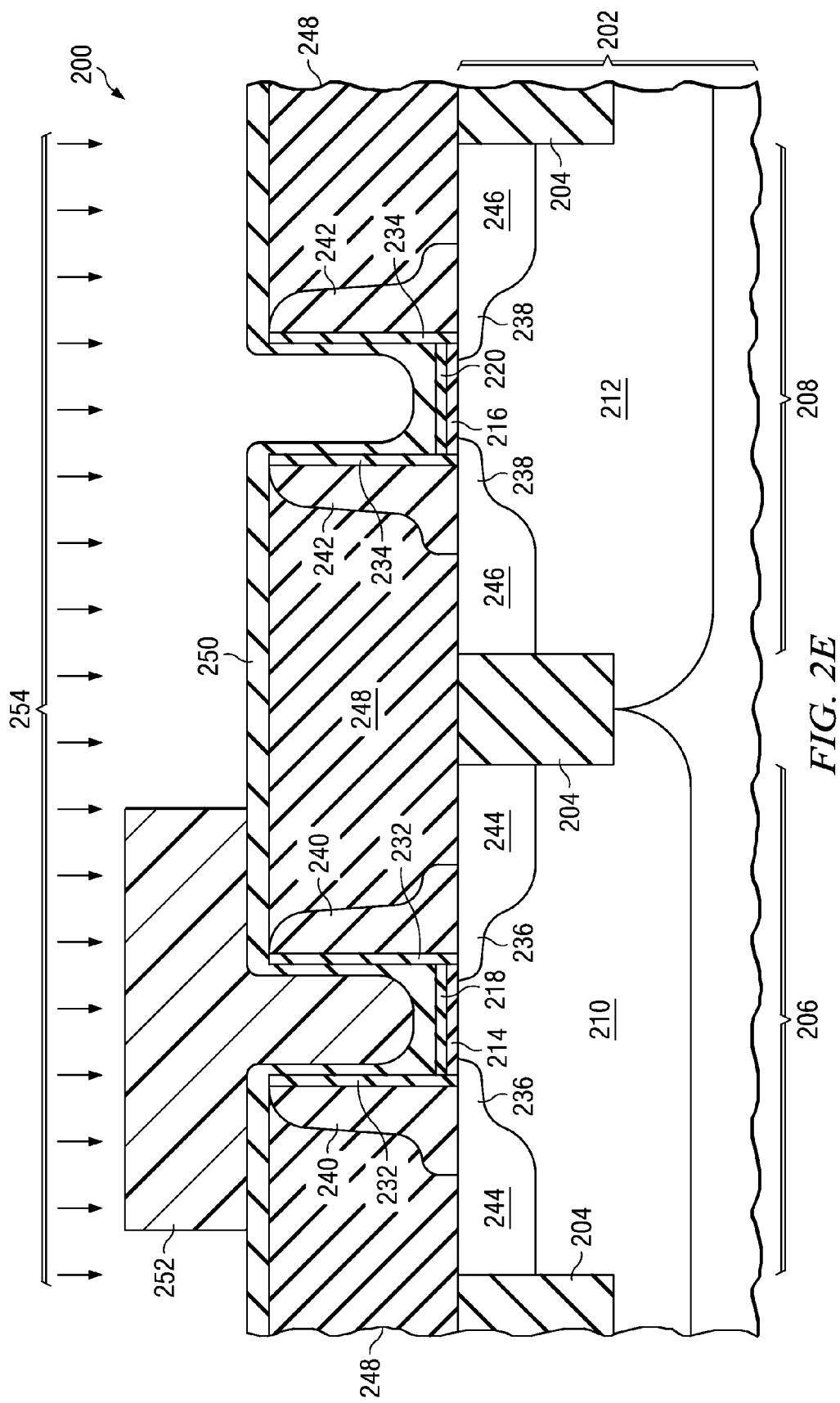

FIG. 2E depicts the IC 100 during formation of an NMOS metal gate. An NMOS metal gate layer 250, possibly titanium nitride or tantalum silicon nitride, preferably between 1 and 10 nanometers thick, is formed on an existing top surface of the IC 100, and particularly on the top surface of the optional NMOS nitrogen containing barrier layer 218, if present, or on the top surface of the NMOS gate dielectric layer 214. An NMOS metal gate layer photoresist pattern 252 is formed on a top surface of the NMOS metal gate layer 250 to define an area for the NMOS metal gate in the NMOS region 206. A NMOS metal gate layer reactive ion etch process 254, for example a plasma containing halogens such as fluorine or chlorine, removes unwanted NMOS metal gate material from areas exposed by the NMOS metal gate layer photoresist pattern 124, in particular the PMOS transistor region 208. In a preferred embodiment, substantially all the unwanted NMOS metal gate material is removed from areas exposed by the NMOS metal gate layer photoresist pattern 252 and substantially none of the PMOS nitrogen containing barrier layer 220 is removed by the NMOS metal gate layer reactive ion etch process 254. The NMOS metal gate layer photoresist pattern 252 is removed in subsequent processing, for example by exposing the IC 200 to an oxygen containing plasma, followed by a wet cleanup to remove any organic residue from the top surface of the NMOS metal gate layer 250.

Figure 2F:
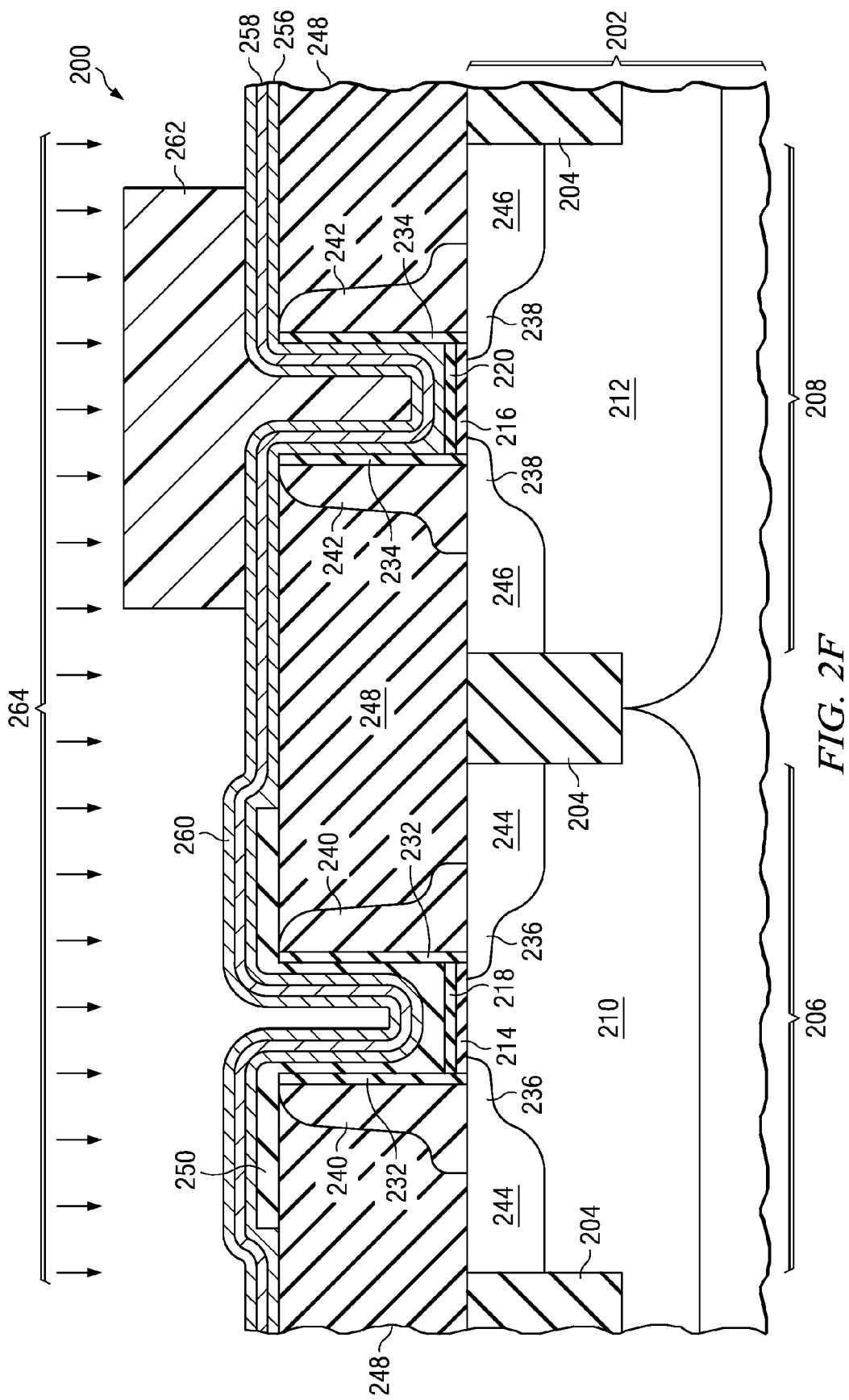

FIG. 2F depicts the IC 200 during formation of a PMOS metal gate stack. A PMOS low oxygen metal layer 256 is formed on an existing top surface of the IC 200 and particularly on the top surface of the PMOS nitrogen containing barrier layer 220. The PMOS low oxygen metal layer 256 is preferably formed of a metal or a mixture of metals with a work function greater than 5 electron volts, as described in reference to FIG. 1C. An oxygen concentration in the PMOS low oxygen metal layer 256 is below 2 percent, and is preferably below 1 percent. The PMOS low oxygen metal layer 256 is preferably between 0.5 and 2 nanometers thick, and is preferably formed by ALD processes, but may be formed by PVD, MOCVD or other deposition processes. A PMOS oxygen rich metal layer 258, as described in reference to FIG. 1D, is formed on a top surface of the PMOS low oxygen metal layer 256. The PMOS oxygen rich metal layer 258 may be formed by depositing an oxygen rich layer of metal on the top surface of the PMOS low oxygen metal layer 256 or may be formed by oxidizing a top region of the PMOS low oxygen metal layer 256. In a preferred embodiment, an oxygen concentration in the PMOS oxygen rich metal layer 258 is greater than 20 percent, but may be as low as 10 percent. In a preferred embodiment, a thickness of the PMOS oxygen rich metal layer 258 is between 0.5 and 2 nanometers. A PMOS top metal gate layer 260, preferably of a same composition as the PMOS low oxygen metal layer 256, but possibly another metal or mixture of metals with a work function greater than 5 electron volts, is formed on a top surface of the PMOS oxygen rich metal layer 258. The PMOS top metal gate layer 260 is preferably formed by ALD processes, but may be formed by PVD, MOCVD or other deposition processes. In a preferred embodiment, a thickness of the PMOS top metal gate layer 260 is between 0.5 and 2 nanometers. A PMOS metal gate stack photoresist pattern 262 is formed on a top surface of the PMOS top metal gate layer 260 to define an area for the PMOS metal gate stack in the PMOS region 208. A PMOS metal gate stack reactive ion etch process 264 removes unwanted material from the PMOS top metal gate layer 260, the PMOS oxygen rich metal layer 258 and the PMOS low oxygen metal layer 256. In a preferred embodiment, the PMOS metal gate stack reactive ion etch process 264 includes three reactive ion etch steps in which gas species, RF power and other process parameters in each step are adjusted to provide clean removal of the PMOS top metal gate layer 260, the PMOS oxygen rich metal layer 258 and the PMOS low oxygen metal layer 256. In a preferred embodiment, substantially all the unwanted PMOS metal gate stack material is removed from areas exposed by the PMOS metal gate stack photoresist pattern 262 and substantially none of the NMOS metal gate layer 250 is removed by the PMOS metal gate stack reactive ion etch process 264. The PMOS metal gate stack photoresist pattern 262 is removed in subsequent processing, for example by exposing the IC 200 to an oxygen containing plasma, followed by a wet cleanup to remove any organic residue from the top surface of the PMOS top metal gate layer 260.

Figure 2G:
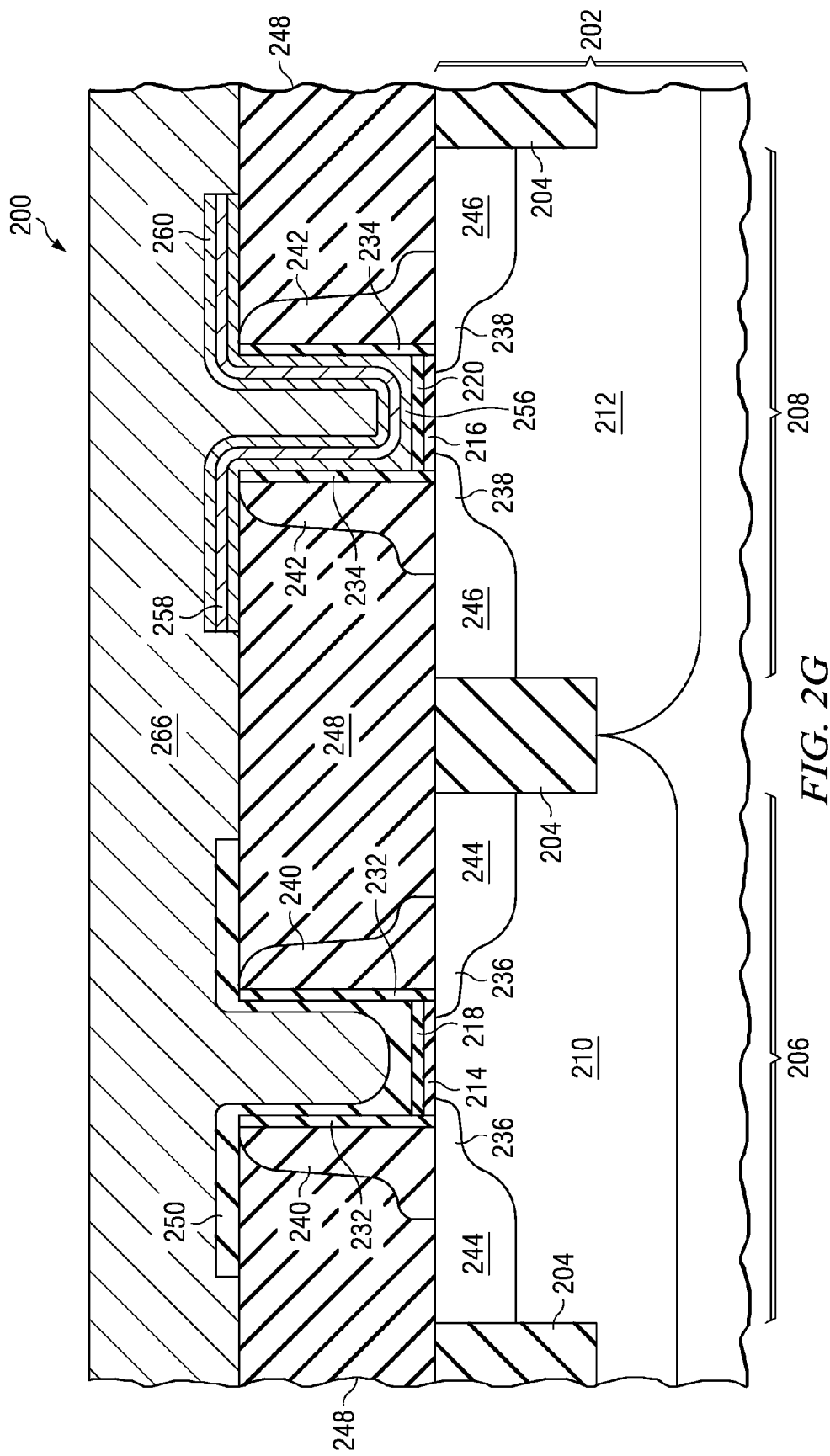

FIG. 2G depicts the IC 200 after a layer of gate fill metal 266 is formed on an existing top surface of the IC 200, particularly in gate cavities between the NMOS offset spacers 232 and PMOS offset spacers 234. The gate fill metal 266 is preferably aluminum or tungsten, but may be any metal with appropriately low electrical resistivity for a desired performance level of the IC 200. In a preferred embodiment, the gate cavities between the NMOS offset spacers 232 and PMOS offset spacers 234 are completely filled with the gate fill metal 266 such that no voids are present in the gate cavities.

Figure 2H:
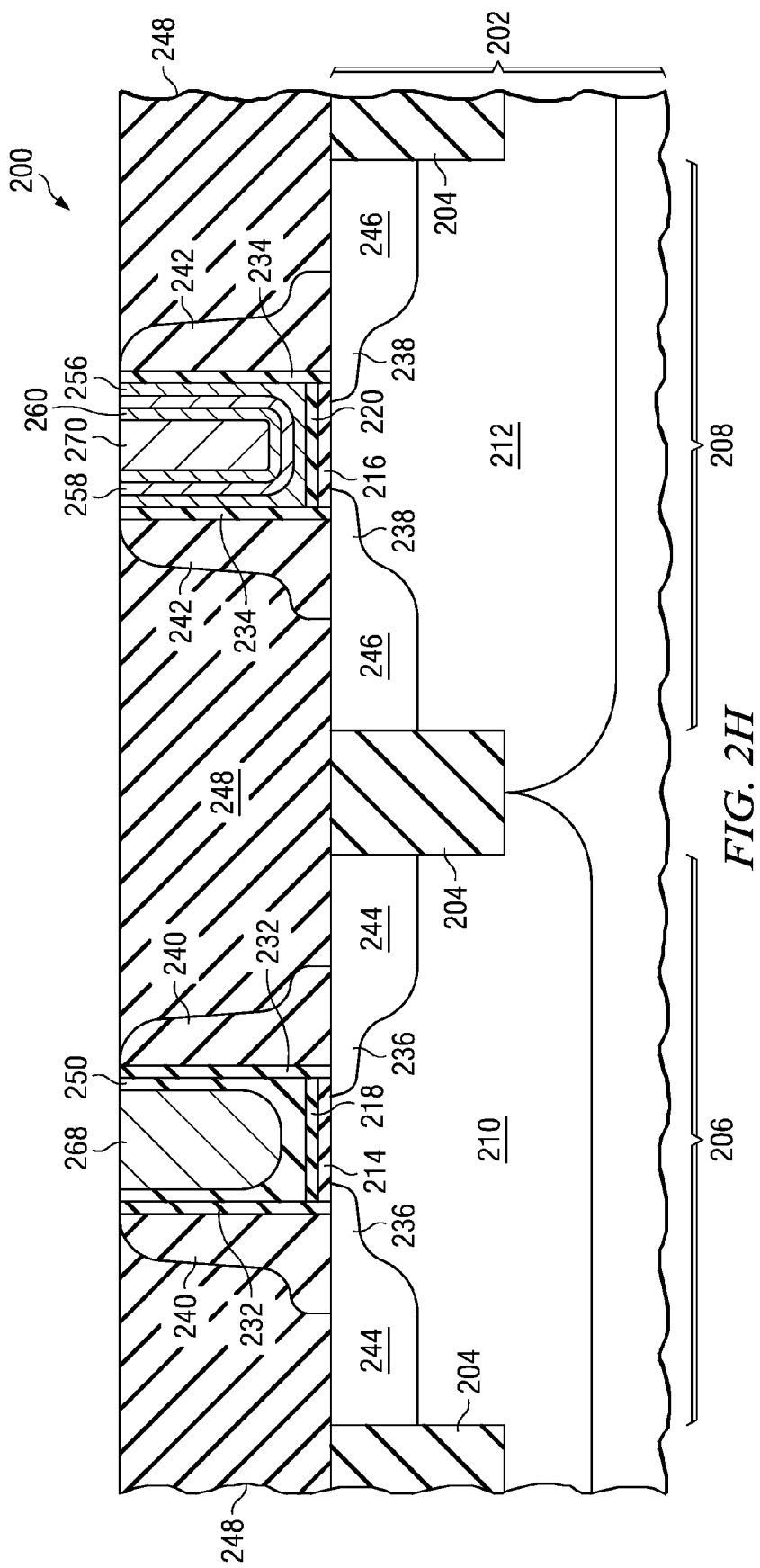

FIG. 2H depicts the IC 200 after a gate planarizing process which removes gate fill metal from a top surface of the oxide fill layer 248, leaving an NMOS fill metal gate 268 in the gate cavity between the NMOS offset spacers 232 and leaving a PMOS fill metal gate 270 in the gate cavity between the PMOS offset spacers 234. The gate fill metal may be removed by an etchback process, for example an isotropic reactive ion etch process including a halogen containing plasma, a CMP process, or other metal planarizing process. In a preferred embodiment, a top surface of the NMOS fill metal gate 268 and a top surface of the PMOS fill metal gate 270 are essentially coplanar with the top surface of the oxide fill layer 248 after the gate planarizing process is completed.

The PMOS nitrogen containing barrier layer 220 desirably reduces oxygen diffusion between the PMOS metal gate layers 244, 246, 248 and the PMOS gate dielectric layer 216, which may improve on-state drive current, especially if the PMOS gate dielectric layer 216 is thinner than 2 nanometers. An oxygen concentration in the PMOS low oxygen metal layer 256 below 2 percent also desirably reduces oxygen diffusion between the PMOS metal gate layers 244, 246, 248 and the PMOS gate dielectric layer 216. An oxygen concentration in the PMOS oxygen rich metal layer 258 above 10 percent desirably increases a work function of the PMOS metal gate layers 244, 246, 248 by 0.2 to 0.3 electron volts.

The embodiment discussed in reference to FIG. 2A through FIG. 2H is advantageous because the processes to form the inventive PMOS gate stack may be integrated into a gate replacement fabrication process sequence of the IC 200 using conventional semiconductor processing equipment.

Figure 3:
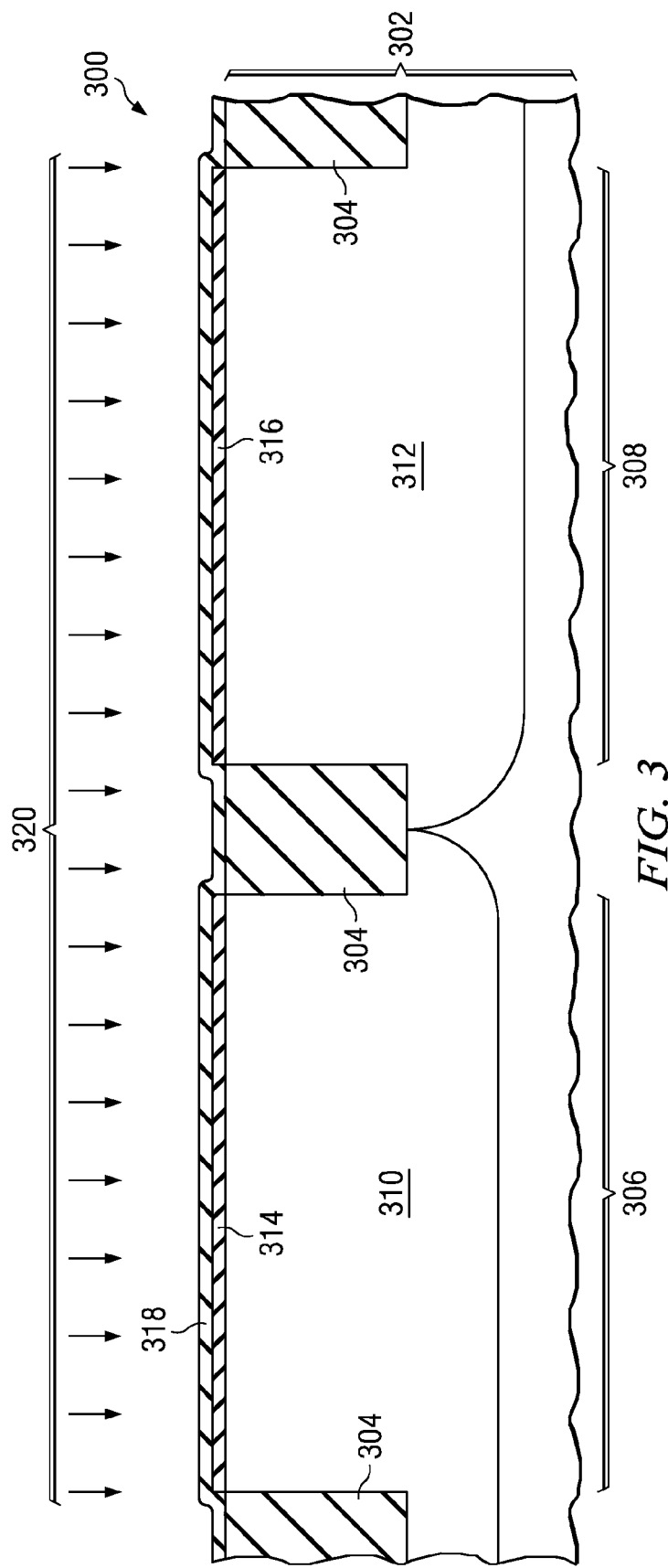
FIG. 3 depicts formation of a nitrogen containing barrier on an IC according to an embodiment of the instant invention.

FIG. 3 depicts formation of a nitrogen containing barrier on an IC according to an embodiment of the instant invention. The IC 300 is formed on a substrate 302 which has the properties described in reference to FIG. 1A. Elements of field isolation 304 are formed in the substrate 302 as described in reference to FIG. 1A. An element of field isolation 304 separates a region in the IC 300 defined for an NMOS transistor 306 from a region in the IC 300 defined for a PMOS transistor 308. A p-well 310 is formed in the substrate 302 in the NMOS region 306, as described in reference to FIG. 1A. Similarly, an n-well 312 is formed in the substrate 302 in the PMOS region 308, as described in reference to FIG. 1A. An NMOS gate dielectric layer 314 is formed on a top surface of the p-well 310, with the properties described in reference to FIG. 1A. A PMOS gate dielectric layer 316 is formed on a top surface of the n-well 312, with the properties described in reference to FIG. 1A. A nitrogen containing barrier layer 318 is formed on a top surface of the NMOS gate dielectric layer 314 and a top surface of the PMOS gate dielectric layer 316 by a nitrogen containing barrier deposition process 320. In one embodiment, the barrier deposition process 320 may be a chemical vapor deposition (CVD) process, for example exposing the IC 300 to $NH_3$ and $SiH_4$ gases at a total pressure between 1 and 760 torr at a temperature between 300 C and 800 C. Another example of a CVD embodiment of the barrier deposition process 320 includes exposing the IC 300 to $NH_3$ and $Si_2H_6$ gases at a total pressure between 1 and 760 torr at a temperature between 300 C and 800 C. A third example of a CVD embodiment of the barrier deposition process 320 includes exposing the IC 300 to $NH_3$ and bis (tertiary-butylamino) silane (BTBAS) gases at a total pressure between 1 and 760 torr at a temperature between 300 C and 800 C. In another embodiment, the barrier deposition process 320 may be a PVD process, for example sputtering from a silicon target in a nitrogen gas ambient at a total pressure between 1 and 500 millitorr at a temperature below 200 C. In a further embodiment, the barrier deposition process 320 may be an ALD process, for example exposing the IC 300 to $NH_3$ and silicon tetrakis dimethylamide (TDMAS) at a total pressure between 1 and 500 millitorr at a temperature between 100 C and 350 C. In a preferred embodiment, the nitrogen containing barrier layer 318 is between 0.3 and 0.5 nanometers thick.

The embodiment discussed in reference to FIG. 3 is advantageous because forming the nitrogen containing barrier layer 318 by a deposition process may provide a stronger barrier to oxygen diffusion than a nitrogen containing barrier layer formed by other means.

Figure 4A:
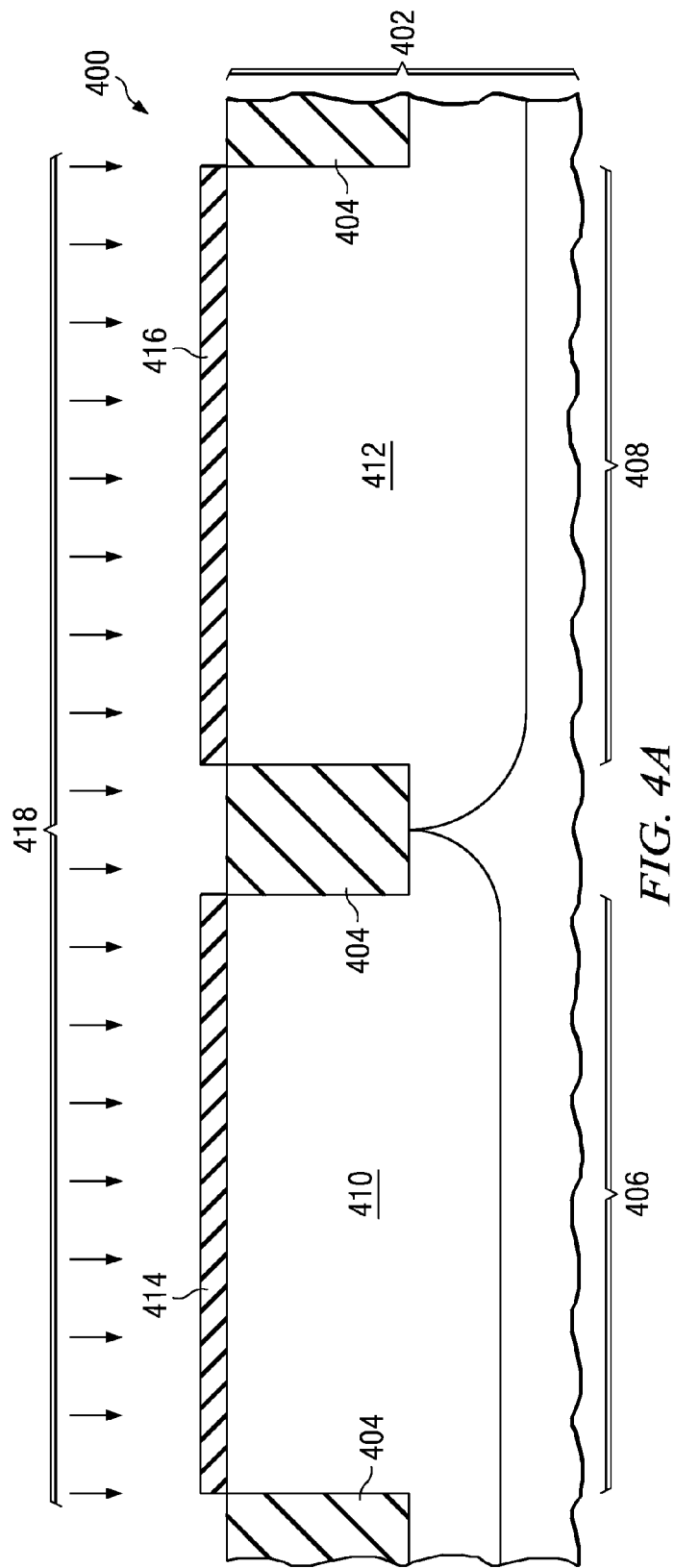
FIG. 4A and FIG. 4B depict formation of a nitrogen containing barrier on an IC according to an alternate embodiment of the instant invention.
Figure 4B:
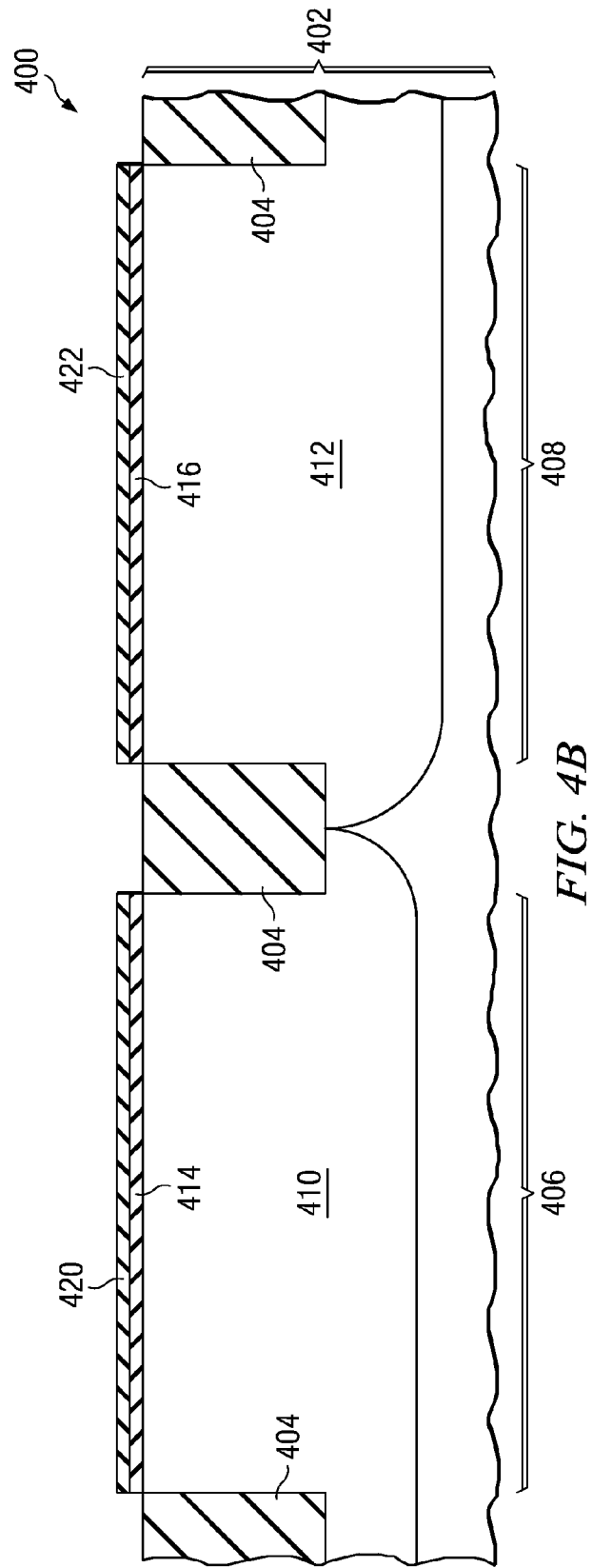

FIG. 4A and FIG. 4B depict formation of a nitrogen containing barrier on an IC according to an alternate embodiment of the instant invention. Referring to FIG. 4A, the IC 400 is formed on a substrate 402 which has the properties described in reference to FIG. 1A. Elements of field isolation 404 are formed in the substrate 402 as described in reference to FIG. 1A. An element of field isolation 404 separates a region in the IC 400 defined for an NMOS transistor 406 from a region in the IC 400 defined for a PMOS transistor 408. A p-well 410 is formed in the substrate 402 in the NMOS region 406, as described in reference to FIG. 1A. Similarly, an n-well 412 is formed in the substrate 402 in the PMOS region 408, as described in reference to FIG. 1A. An NMOS gate dielectric layer 414 is formed on a top surface of the p-well 410, with the properties described in reference to FIG. 1A. A PMOS gate dielectric layer 416 is formed on a top surface of the n-well 412, with the properties described in reference to FIG. 1A. A barrier nitridation process 418 is performed on a top surface of the NMOS gate dielectric layer 414 and a top surface of the PMOS gate dielectric layer 416 which adds nitrogen to a top region of the NMOS gate dielectric layer 414 and a top region of the PMOS gate dielectric layer 416. In one embodiment, the barrier nitridation process 418 may be a first plasma process in which an existing top surface of the IC 400 is exposed to a plasma formed by providing between 500 and 2500 watts of radio frequency (RF) power to a mixture of argon gas and nitrogen gas with an argon to nitrogen ratio between 50 to 1 and 200 to 1, at a total pressure between 100 and 300 millitorr, at a temperature between 200 C and 400 C. In another embodiment, the barrier nitridation process 418 may be a second plasma process in which an existing top surface of the IC 400 is exposed to a plasma formed by providing between 250 to 1500 watts of RF power to nitrogen gas at a pressure between 5 and 30 millitorr, at a temperature between 30 C and 150 C. In a further embodiment, the barrier nitridation process 418 may be a thermal process in which an existing top surface of the IC 400 is exposed to $NH_3$ gas at a pressure between 500 and 760 torr at a temperature between 700 C and 900 C.

Referring to FIG. 4B, an NMOS nitrogen containing barrier layer 420 is formed in the top region of the NMOS gate dielectric layer 414 and a PMOS nitrogen containing barrier layer 422 is formed in the top region of the PMOS gate dielectric layer 416 by the barrier nitridation process. In a preferred embodiment, a thickness of the PMOS nitrogen containing barrier layer 422 is between 0.3 and 0.5 nanometers.

The embodiment discussed in reference to FIG. 4A and FIG. 4B is advantageous because forming the PMOS nitrogen containing barrier layer 422 by a nitridation process may provide desirably fewer interface traps than a nitrogen containing barrier layer formed by other means.

Figure 5A:
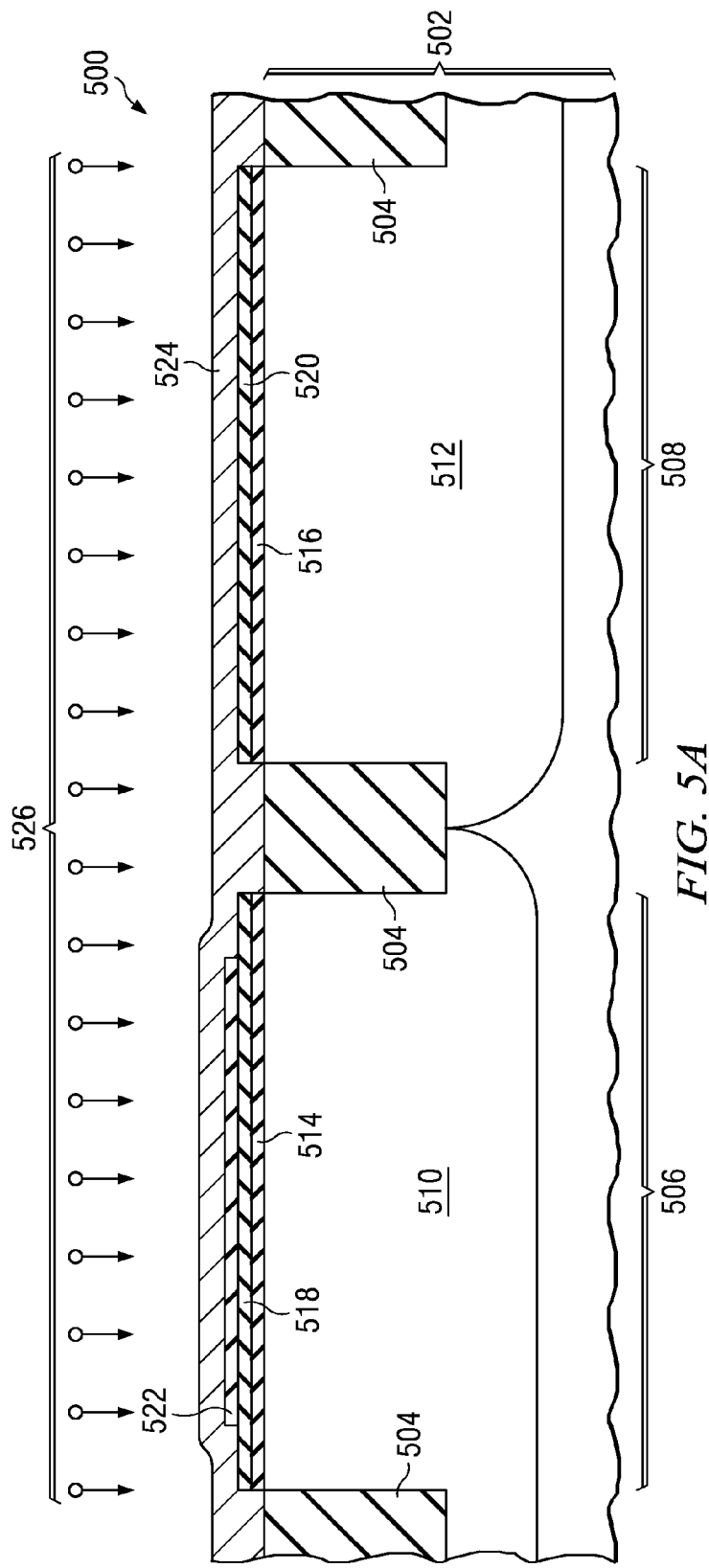
FIG. 5A through FIG. 5C depict formation of a PMOS metal gate stack on an IC according to one embodiment of the instant invention.
Figure 5B:
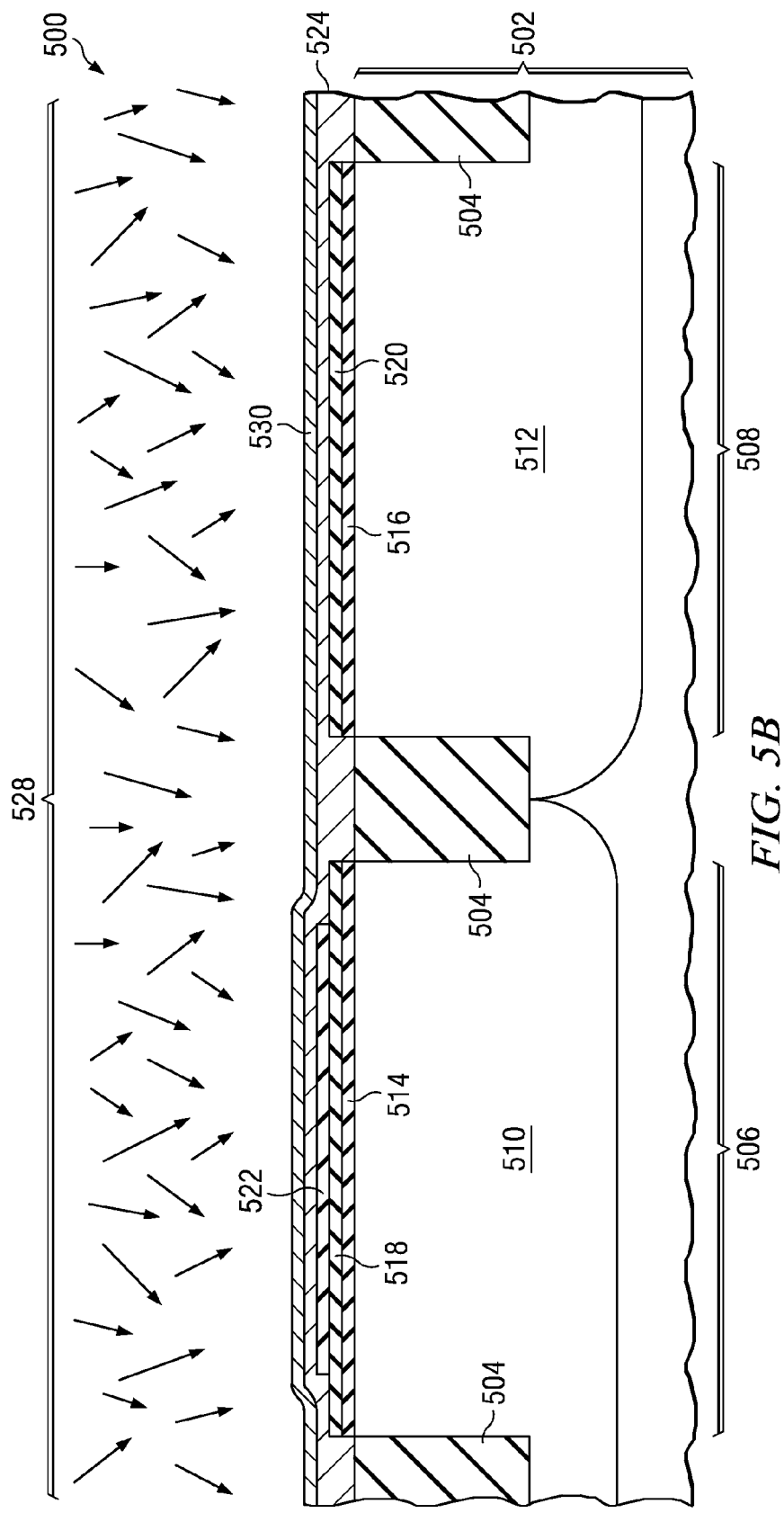
Figure 5C:
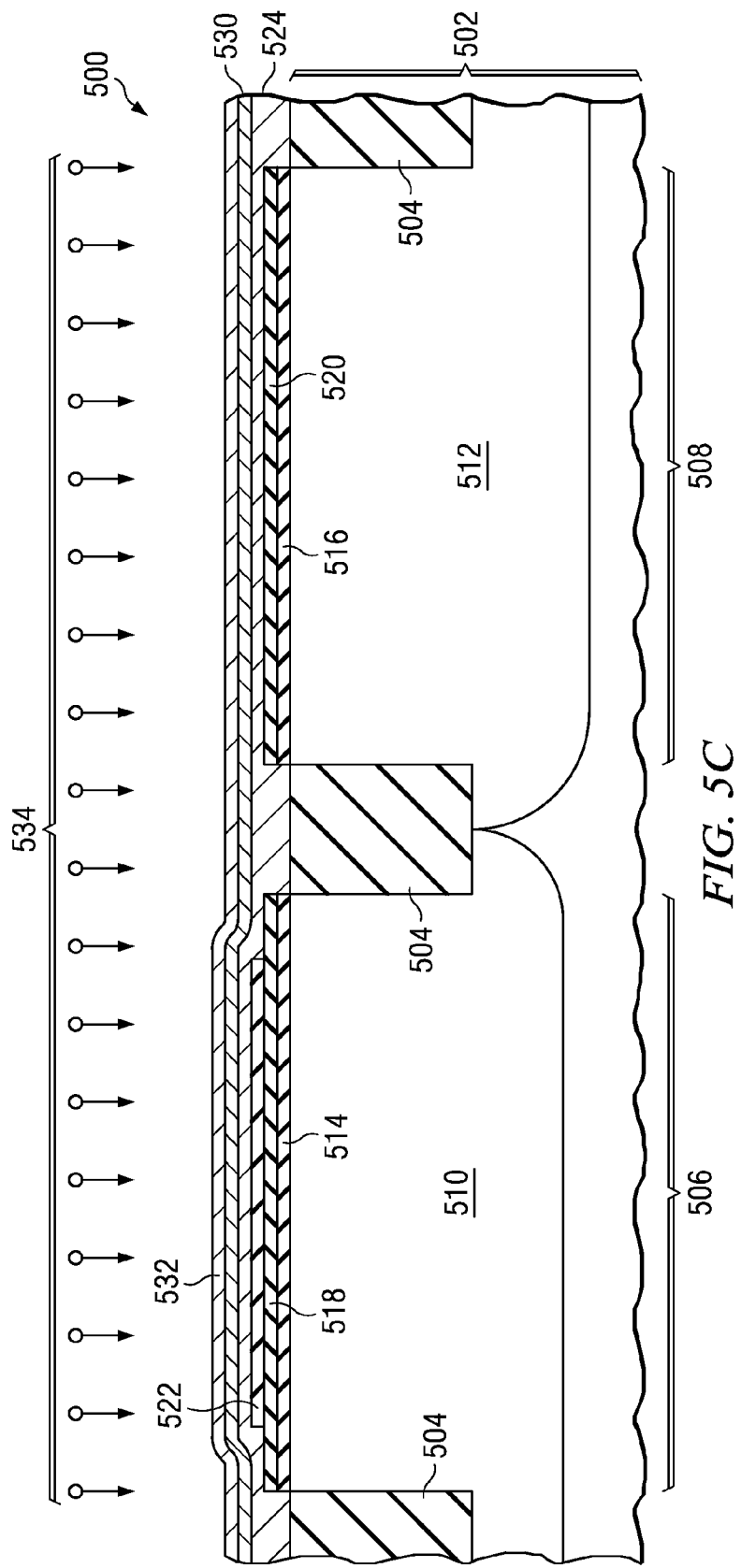

FIG. 5A through FIG. 5C depict formation of a PMOS metal gate stack on an IC according to one embodiment of the instant invention. Referring to FIG. 5A, the IC 500 is formed on a substrate 502 which has the properties described in reference to FIG. 1A. Elements of field isolation 504 are formed in the substrate 502 as described in reference to FIG. 1A. An element of field isolation 504 separates a region in the IC 500 defined for an NMOS transistor 506 from a region in the IC 500 defined for a PMOS transistor 508. A p-well 510 is formed in the substrate 502 in the NMOS region 506, as described in reference to FIG. 1A. Similarly, an n-well 512 is formed in the substrate 502 in the PMOS region 508, as described in reference to FIG. 1A. An NMOS gate dielectric layer 514 is formed on a top surface of the p-well 510, with the properties described in reference to FIG. 1A. A PMOS gate dielectric layer 516 is formed on a top surface of the n-well 512, with the properties described in reference to FIG. 1A. An NMOS nitrogen containing barrier layer 518 is formed in the top region of the NMOS gate dielectric layer 514 and a PMOS nitrogen containing barrier layer 520 is formed in the top region of the PMOS gate dielectric layer 516, by a process as described in reference to FIG. 3 or as described in reference to FIG. 4A and FIG. 4B. An NMOS metal gate layer 522 is formed on a top surface of the NMOS nitrogen containing barrier layer 518, as described in reference to FIG. 1B. A PMOS low oxygen metal layer 524 is formed on a top surface of the PMOS nitrogen containing barrier layer 520 and a top surface of the NMOS metal gate layer 522, of the materials described in reference to FIG. 1C, by a low oxygen metal deposition process 526. In a preferred embodiment, the low oxygen metal deposition process 526 may be an ALD process, for example exposing the IC 500 to a metal precursor gas such as $WCl_4$ at a total pressure between 1 and 500 millitorr at a temperature between 100 C and 350 C. In an alternate embodiment, the low oxygen metal deposition process 526 may be a CVD process, for example exposing the IC 500 to a metal precursor gas such as $WF_6$ at a total pressure between 1 and 760 torr at a temperature between 300 C and 800 C. In a further embodiment, the low oxygen metal deposition process 526 may be a PVD process, for example sputtering a metal such as palladium, tungsten, molybdenum, ruthenium, nickel and/or iridium from a metal target in an argon ambient at a total pressure between 1 and 500 millitorr at a temperature between 30 C and 200 C. In a preferred embodiment, the PMOS low oxygen metal layer 524 is between 1 and 4 nanometers thick, as deposited.

Referring to FIG. 5B, a gate metal oxidation process 528 is performed on the IC 500 which infuses oxygen into a top region of the PMOS low oxygen metal layer 524 to form a PMOS oxygen rich metal layer 530. In a preferred embodiment of the gate metal oxidation process 528, the PMOS oxygen rich metal layer 530 extends from a top surface of the PMOS low oxygen metal layer 524 to a depth between 0.5 and 2 nanometers and is provided an oxygen concentration greater than 20 percent, but other embodiments may provide an oxygen concentration between 10 percent and 20 percent. In one embodiment of the instant invention, the gate metal oxidation process 528 may be an oxidizing plasma process, for example exposing the IC 500 to a plasma formed by providing between 1000 and 3000 watts of RF power to a mixture of argon gas and oxygen gas with an argon to oxygen ratio between 5 to 1 and 20 to 1, at a total pressure between 0.5 and 2 torr, at a temperature between 200 C and 400 C. In an alternate embodiment, the gate metal oxidation process 528 may be a thermal oxidation process, for example exposing the IC 500 to an ambient which includes oxygen and/or ozone at a total pressure between 1 and 760 torr at a temperature between 400 C and 800 C.

Referring to FIG. 5C, a PMOS top metal gate layer 532, preferably of a same composition as the PMOS low oxygen metal layer 524, but possibly another metal or mixture of metals with a work function greater than 5 electron volts, is formed on a top surface of the PMOS oxygen rich metal layer 530 by a top metal gate deposition process 534. The top metal gate deposition process 534 may be an ALD process as described in reference to FIG. 5A, a CVD process as described in reference to FIG. 5A, or a PVD process as described in reference to FIG. 5A. In a preferred embodiment, the PMOS top metal gate layer 532 is between 0.5 and 2 nanometers thick.

The embodiments discussed in reference to FIG. 5A through FIG. 5C are advantageous because the oxygen concentration in the PMOS oxygen rich metal layer 530 may be adjusted by varying an exposure time of the IC to the gate metal oxidation process 528 which desirably impacts a fabrication process sequence of the IC 500 less than other methods of forming the PMOS oxygen rich metal layer 530.

It will be recognized by workers familiar with gate replacement fabrication processes that the planar embodiments described in reference to FIG. 5A through FIG. 5C may be applied to gate replacement processes.

Figure 6A:
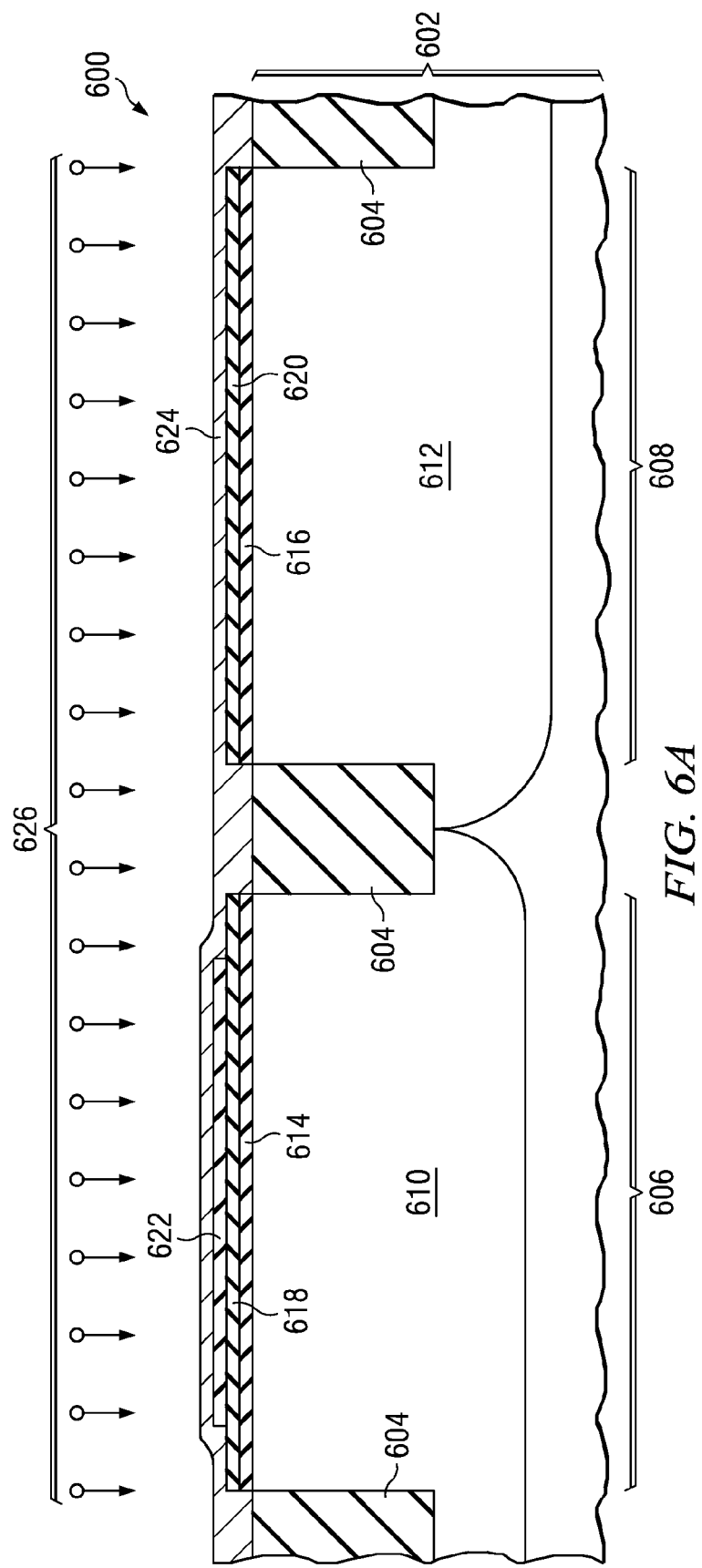
FIG. 6A through FIG. 6C depict formation of a PMOS metal gate stack on an IC according to an alternate embodiment of the instant invention.
Figure 6B:
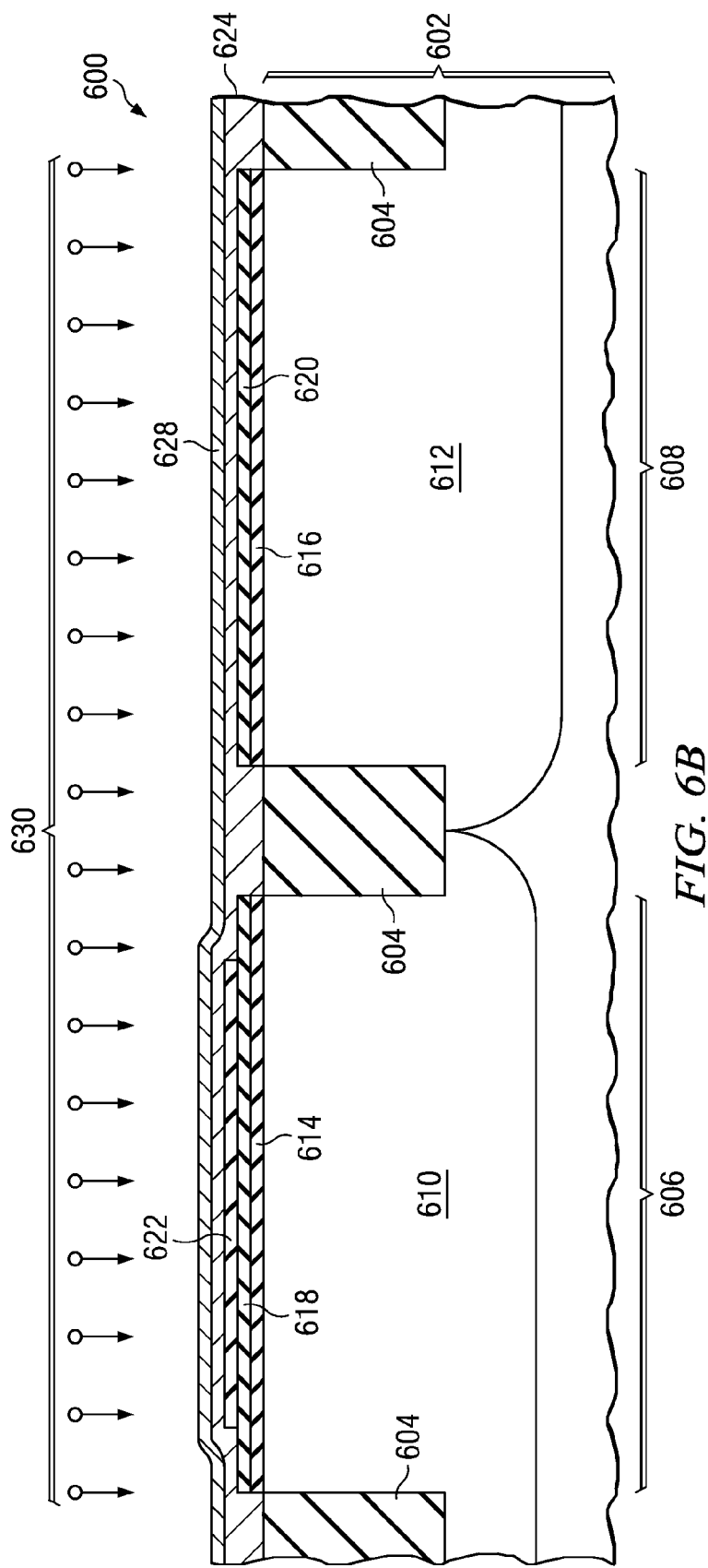
Figure 6C:
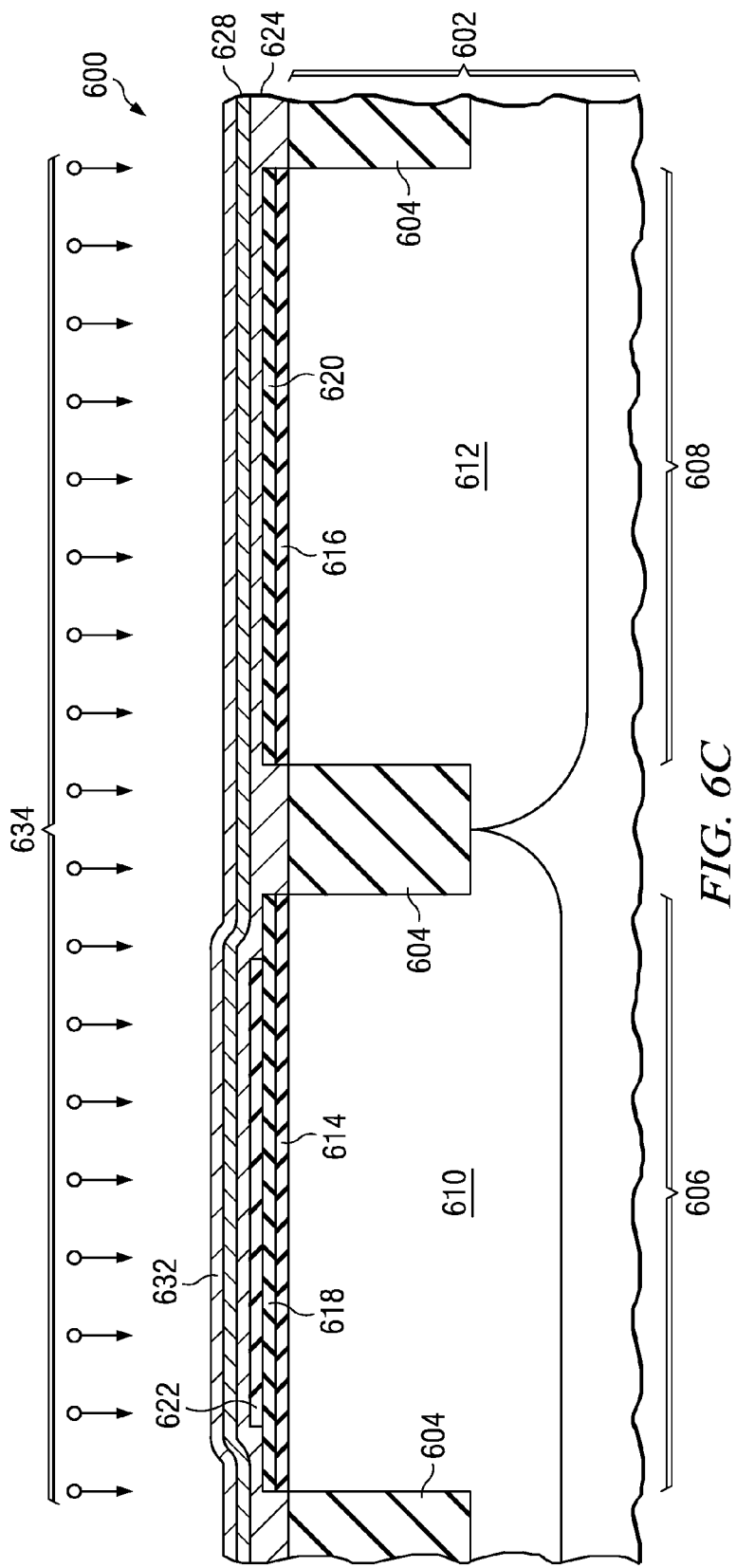

FIG. 6A through FIG. 6C depict formation of a PMOS metal gate stack on an IC according to an alternate embodiment of the instant invention. Referring to FIG. 6A, the IC 600 is formed on a substrate 602 which has the properties described in reference to FIG. 1A. Elements of field isolation 604 are formed in the substrate 602 as described in reference to FIG. 1A. An element of field isolation 604 separates a region in the IC 600 defined for an NMOS transistor 606 from a region in the IC 600 defined for a PMOS transistor 608. A p-well 610 is formed in the substrate 602 in the NMOS region 606, as described in reference to FIG. 1A. Similarly, an n-well 612 is formed in the substrate 602 in the PMOS region 608, as described in reference to FIG. 1A. An NMOS gate dielectric layer 614 is formed on a top surface of the p-well 610, with the properties described in reference to FIG. 1A. A PMOS gate dielectric layer 616 is formed on a top surface of the n-well 612, with the properties described in reference to FIG. 1A. An NMOS nitrogen containing barrier layer 618 is formed in the top region of the NMOS gate dielectric layer 614 and a PMOS nitrogen containing barrier layer 620 is formed in the top region of the PMOS gate dielectric layer 616, by a process as described in reference to FIG. 3 or as described in reference to FIG. 4A and FIG. 4B. An NMOS metal gate layer 622 is formed on a top surface of the NMOS nitrogen containing barrier layer 618, as described in reference to FIG. 1B. A PMOS low oxygen metal layer 624 is formed on a top surface of the PMOS nitrogen containing barrier layer 620 and a top surface of the NMOS metal gate layer 622, of the materials described in reference to FIG. IC, by a low oxygen metal deposition process 626 as described in reference to FIG. 5A. In a preferred embodiment, the PMOS low oxygen metal layer 624 is between 0.5 and 2 nanometers thick, as deposited.

Referring to FIG. 6B, a PMOS oxygen rich metal layer 628 is deposited on a top surface of the PMOS low oxygen metal layer 624 by an oxygen rich metal deposition process 630. In a preferred embodiment, the PMOS oxygen rich metal layer 628 is between 0.5 and 2 nanometers thick and has an oxygen concentration greater than 20 percent, but in other embodiments may have an oxygen concentration between 10 percent and 20 percent. In a preferred embodiment of the instant invention, the oxygen rich metal deposition process 630 may be an ALD process, for example exposing the IC 600 to a mixture of a metal precursor gas such as $WCl_4$ and an oxidizing gas such as $H_2O$ vapor or ozone, at a total pressure between 1 and 500 millitorr, at a temperature between 100 C and 350 C. In an alternate embodiment of the instant invention, the oxygen rich metal deposition process 630 may be a CVD process, for example exposing the IC 600 to a mixture of a metal precursor gas such as $WF_6$ and an oxidizing gas such as oxygen or ozone, at a total pressure between 1 and 760 torr, at a temperature between 300 C and 800 C. In a further embodiment, the oxygen rich metal deposition process 630 may be a PVD process, for example sputtering a metal such as palladium, tungsten, molybdenum, ruthenium, nickel and/or iridium from a metal target in an oxygen ambient at a total pressure between 1 and 500 millitorr at a temperature between 30 C and 200 C.

Referring to FIG. 6C, a PMOS top metal gate layer 632, preferably of a same composition as the PMOS low oxygen metal layer 624, but possibly another metal or mixture of metals with a work function greater than 5 electron volts, is formed on a top surface of the PMOS oxygen rich metal layer 628 by a top metal gate deposition process 634. The top metal gate deposition process 634 may be an ALD process as described in reference to FIG. 5A, a CVD process as described in reference to FIG. 5A, or a PVD process as described in reference to FIG. 5A. In a preferred embodiment, the PMOS top metal gate layer 632 is between 0.5 and 2 nanometers thick.

The embodiments discussed in reference to FIG. 6A through FIG. 6C are advantageous because a thickness of the PMOS oxygen rich metal layer 628 may be adjusted more easily while maintaining a consistent oxygen concentration than in other methods of forming the PMOS oxygen rich metal layer 628.

It will be recognized by workers familiar with gate replacement fabrication processes that the planar embodiments described in reference to FIG. 6A through FIG. 6C may be applied to gate replacement processes.

What is claimed is:

1. A process of forming an integrated circuit comprising the steps of:
    forming PMOS transistor by a process further including the steps of:
        forming a PMOS nitrogen containing barrier layer on a top surface of a PMOS gate dielectric layer;
        forming a PMOS low oxygen metal layer with a work function greater than 5 electron volts and an oxygen concentration less than 2 percent, on a top surface of said PMOS nitrogen containing barrier layer;
        forming a PMOS oxygen rich metal layer with a work function greater than 5 electron volts and an oxygen concentration greater then 10 percent, on a top surface of said PMOS low oxygen metal layer; and
        forming a PMOS top metal layer with a work function greater than 5 electron volts, on a top surface of said PMOS oxygen rich metal layer; and
    forming an NMOS transistor by a process further including the step of forming a metal gate layer with a work function less than 5 electron volts and an oxygen concentration less than 2 percent, on a top surface of an NMOS gate dielectric layer.

2. The process of claim 1, in which said PMOS nitrogen containing barrier layer is between 0.3 and 0.5 nanometers thick.

3. The process of claim 1, in which said PMOS low oxygen metal layer is between 0.5 and 2 nanometers thick.

4. The process of claim 1, in which said PMOS oxygen rich metal layer is between 0.5 and 2 nanometers thick.

5. The process of claim 1, in which said step of forming a PMOS nitrogen containing barrier layer further includes the step of performing a chemical vapor deposition (CVD) process in which said PMOS gate dielectric layer is exposed to $NH_3$ gas and a silicon containing gas at a temperature between 300 C and 800 C so that said PMOS nitrogen containing barrier layer is deposited on said top surface of said PMOS gate dielectric layer, such that said PMOS nitrogen containing barrier layer has a different chemical composition than said PMOS gate dielectric layer.

6. The process of claim 1, in which said step of forming a PMOS nitrogen containing barrier layer further includes the step of performing an atomic layer deposition (ALD) process in which said PMOS gate dielectric layer is exposed to $NH_3$ gas and a silicon precursor gas at a temperature between 100 C and 350 C so that said PMOS nitrogen containing barrier layer is deposited on said top surface of said PMOS gate dielectric layer, such that said PMOS nitrogen containing barrier layer has a different chemical composition than said PMOS gate dielectric layer.

7. The process of claim 1, in which said step of forming a PMOS nitrogen containing barrier layer further includes the step of exposing said PMOS gate dielectric layer to a nitrogen containing plasma so that nitrogen is added to a top region of said PMOS gate dielectric layer.

8. The process of claim 1, in which said step of forming a PMOS nitrogen containing barrier layer further includes the step of exposing said PMOS gate dielectric layer to $NH_3$ gas at a pressure between 500 and 760 torr at a temperature between 700 C and 900 C so that nitrogen is added to a top region of said PMOS gate dielectric layer.

9. The process of claim 1, in which said step of forming a PMOS oxygen rich metal layer further includes the step of performing an physical vapor deposition (PVD) process in which a metal with a work function greater than 5 electron volts is sputtered from a metal target in an oxygen containing ambient onto said top surface of said PMOS low oxygen metal layer so that said PMOS oxygen rich metal layer has an oxygen content greater than 20 percent.

10. The process of claim 1, in which said step of forming a PMOS oxygen rich metal layer further includes the step of exposing said PMOS low oxygen metal layer to an oxygen containing plasma so that oxygen is added to a top region of said PMOS low oxygen metal layer.

11. The process of claim 1, in which said step of forming a PMOS oxygen rich metal layer further includes the step of exposing said PMOS low oxygen metal layer to an oxygen and ozone containing ambient at a temperature between 400 C and 800 so that oxygen is added to a top region of said PMOS low oxygen metal layer.

* * * * *